(12) United States Patent
Scheuerlein et al.

(10) Patent No.: US 7,505,321 B2
(45) Date of Patent: Mar. 17, 2009

(54) PROGRAMMABLE MEMORY ARRAY STRUCTURE INCORPORATING SERIES-CONNECTED TRANSISTOR STRINGS AND METHODS FOR FABRICATION AND OPERATION OF SAME

(75) Inventors: Roy E. Scheuerlein, Cupertino, CA (US); Christopher Petti, Mountain View, CA (US); Andrew J. Walker, Mountain View, CA (US); En-Hsing Chen, Sunnyvale, CA (US); Sucheta Nallamothu, San Jose, CA (US); Alper Ilkbahar, San Jose, CA (US); Luca Fasoli, San Jose, CA (US); Igor Koutnetsov, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 307 days.

(21) Appl. No.: 10/335,078

(22) Filed: Dec. 31, 2002

(65) Prior Publication Data
US 2004/0125629 A1 Jul. 1, 2004

(51) Int. Cl.
G11C 11/34 (2006.01)
G11C 16/04 (2006.01)
G11C 5/06 (2006.01)
G11C 8/00 (2006.01)

(52) U.S. Cl. .............. 365/185.17; 365/63; 365/185.11; 365/185.13; 365/185.18; 365/230.03

(58) Field of Classification Search ............ 365/185.17, 365/185.24, 185.11, 185.18, 185.05, 185.13, 365/130, 230.03
See application file for complete search history.

(56) References Cited

U.S. PATENT DOCUMENTS 4,142,176 A 2/1979 Dozier (Continued)

FOREIGN PATENT DOCUMENTS

EP 0073486 A2 3/1983

(Continued)

OTHER PUBLICATIONS

U.S. Appl. No. 10/326,470, filed Dec. 19, 2002, entitled "An Improved Method for Making High-Density Nonvolatile Memory", naming inventors S. Brad Herner, Maitreyee Mahajani and Michael A. Vyvoda.*

(Continued)

Primary Examiner—Ly D Pham
(74) Attorney, Agent, or Firm—Zagorin O'Brien Graham LLP

(57) ABSTRACT

A three-dimensional flash memory array incorporates thin film transistors having a charge storage dielectric arranged in series-connected NAND strings to achieve a $4F^2$ memory cell layout. The memory array may be programmed and erased using only tunneling currents, and no leakage paths are formed through non-selected memory cells. Each NAND string includes two block select devices for respectively coupling one end of the NAND string to a global bit line, and the other end to a shared bias node. Pairs of NAND strings within a block share the same global bit line. The memory cells are preferably depletion mode SONOS devices, as are the block select devices. The memory cells may be programmed to a near depletion threshold voltage, and the block select devices are maintained in a programmed state having a near depletion mode threshold voltage. NAND strings on more than one layer may be connected to global bit lines on a single layer. By interleaving the NAND strings on each memory level and using two shared bias nodes per block, very little additional overhead is required for the switch devices at each end of the NAND strings. The NAND strings on different memory levels are preferably connected together by way of vertical stacked vias, each preferably connecting to more than one memory level. Each memory level may be produced with less than three masks per level.

32 Claims, 22 Drawing Sheets

U.S. PATENT DOCUMENTS

| | | | |
|---|---|---|---|
| 4,602,354 A | 7/1986 | Craycraft et al. | |
| 4,646,266 A | 2/1987 | Ovshinsky et al. | |
| 4,868,616 A | 9/1989 | Johnson et al. | |
| 5,197,027 A | 3/1993 | Challa | |
| 5,223,747 A | 6/1993 | Tschulena | |
| 5,301,144 A | 4/1994 | Kohno | |
| 5,429,968 A | 7/1995 | Koyama | |
| 5,473,563 A | 12/1995 | Suh et al. | |
| 5,514,907 A | 5/1996 | Moshayedi | |
| 5,568,421 A | 10/1996 | Aritome | |
| 5,590,072 A * | 12/1996 | Choi | 365/185.01 |
| 5,621,683 A | 4/1997 | Young | |
| 5,621,684 A | 4/1997 | Jung | |
| 5,682,350 A * | 10/1997 | Lee et al. | 365/185.13 |
| 5,696,717 A * | 12/1997 | Koh | 365/185.22 |
| 5,703,382 A | 12/1997 | Hack et al. | |
| 5,715,194 A | 2/1998 | Hu | |
| 5,729,491 A * | 3/1998 | Kim et al. | 365/185.17 |
| 5,734,609 A | 3/1998 | Choi et al. | |
| 5,751,012 A | 5/1998 | Wolstenholme et al. | |
| 5,761,125 A * | 6/1998 | Himeno | 365/185.24 |
| RE35,838 E | 7/1998 | Momodomi et al. | |
| 5,812,457 A | 9/1998 | Arase | |
| 5,814,853 A | 9/1998 | Chen | |
| 5,835,396 A | 11/1998 | Zhang | |
| 5,877,980 A * | 3/1999 | Mang et al. | 365/185.17 |
| 5,898,615 A | 4/1999 | Chida | |
| 5,909,393 A | 6/1999 | Tran et al. | |
| 5,926,415 A | 7/1999 | Shin | |
| 5,955,757 A * | 9/1999 | Jen et al. | 257/296 |
| 5,969,990 A * | 10/1999 | Arase | 365/185.25 |
| 5,978,265 A | 11/1999 | Kirisawa et al. | |
| 5,991,202 A | 11/1999 | Derhacobian et al. | |
| 6,005,270 A | 12/1999 | Noguchi | |
| 6,034,882 A | 3/2000 | Johnson et al. | |
| 6,049,494 A | 4/2000 | Sakui et al. | |
| 6,055,180 A | 4/2000 | Gudesen et al. | |
| 6,061,270 A | 5/2000 | Choi | |
| 6,091,666 A * | 7/2000 | Arase et al. | 365/238.5 |
| 6,107,658 A | 8/2000 | Itoh et al. | |
| 6,108,238 A | 8/2000 | Nakamura et al. | |
| 6,115,287 A * | 9/2000 | Shimizu et al. | 365/185.17 |
| 6,147,911 A | 11/2000 | Takeuchi et al. | |
| 6,151,249 A | 11/2000 | Shirota et al. | |
| 6,157,056 A | 12/2000 | Takeuchi et al. | |
| 6,163,048 A | 12/2000 | Hirose et al. | |
| 6,185,122 B1 | 2/2001 | Johnson et al. | |
| 6,188,611 B1 | 2/2001 | Endoh et al. | |
| 6,266,275 B1 | 7/2001 | Chen et al. | |
| 6,291,836 B1 | 9/2001 | Kramer et al. | |
| 6,301,155 B1 | 10/2001 | Fujiwara | |
| 6,307,807 B1 | 10/2001 | Sakui et al. | |
| 6,326,269 B1 | 12/2001 | Jeng et al. | |
| 6,335,890 B1 | 1/2002 | Reohr et al. | |
| 6,370,081 B1 * | 4/2002 | Sakui et al. | 365/238.5 |
| 6,373,746 B1 | 4/2002 | Takeuchi et al. | |
| 6,380,636 B1 | 4/2002 | Tatsukawa et al. | |
| 6,411,548 B1 * | 6/2002 | Sakui et al. | 365/185.17 |
| 6,420,215 B1 | 7/2002 | Knall et al. | |
| 6,445,030 B1 * | 9/2002 | Wu et al. | 257/315 |
| 6,445,613 B1 | 9/2002 | Nagai | |
| 6,456,528 B1 | 9/2002 | Chen | |
| 6,469,933 B2 | 10/2002 | Choi et al. | |
| 6,473,328 B1 | 10/2002 | Mercaldi | |
| 6,477,077 B1 | 11/2002 | Okazawa | |
| 6,490,194 B2 | 12/2002 | Hoenigschmid | |
| 6,512,703 B2 | 1/2003 | Sakui et al. | |
| 6,515,888 B2 | 2/2003 | Johnson et al. | |
| 6,522,594 B1 | 2/2003 | Scheuerlein | |
| 6,525,953 B1 | 2/2003 | Johnson | |
| 6,542,407 B1 * | 4/2003 | Chen et al. | 365/185.17 |
| 6,545,898 B1 | 4/2003 | Scheuerlein | |
| 6,567,287 B2 | 5/2003 | Scheuerlein | |
| 6,567,312 B1 | 5/2003 | Torii et al. | |
| 6,584,006 B2 | 6/2003 | Viehmann | |
| 6,597,609 B2 | 7/2003 | Chevallier | |
| 6,611,453 B2 | 8/2003 | Ning | |
| 6,614,070 B1 * | 9/2003 | Hirose et al. | 257/316 |
| 6,614,688 B2 | 9/2003 | Jeong et al. | |
| 6,618,292 B2 | 9/2003 | Sakui | |
| 6,618,295 B2 | 9/2003 | Scheuerlein | |
| 6,621,743 B2 | 9/2003 | Ogane | |
| 6,631,085 B2 | 10/2003 | Kleveland et al. | |
| 6,661,707 B2 | 12/2003 | Choi et al. | |
| 6,678,191 B2 * | 1/2004 | Lee et al. | 365/185.33 |
| 6,735,115 B2 | 5/2004 | Hsu et al. | |
| 6,747,899 B2 * | 6/2004 | Hsia et al. | 365/185.28 |
| 6,757,196 B1 | 6/2004 | Tsao et al. | |
| 6,765,813 B2 | 7/2004 | Scheuerlein et al. | |
| 6,794,246 B2 * | 9/2004 | Forbes et al. | 438/257 |
| 6,813,199 B2 | 11/2004 | Hidaka | |
| 6,819,593 B2 | 11/2004 | Shyu et al. | |
| 6,841,813 B2 | 1/2005 | Walker et al. | |
| 6,845,030 B2 | 1/2005 | Kang et al. | |
| 6,845,042 B2 | 1/2005 | Ichige et al. | |
| 6,888,755 B2 | 5/2005 | Harari | |
| 6,975,539 B2 | 12/2005 | Tran | |
| 6,982,902 B2 | 1/2006 | Gogl et al. | |
| 6,987,694 B2 | 1/2006 | Lee | |
| 7,012,835 B2 | 3/2006 | Gonzalez et al. | |
| 7,129,538 B2 | 10/2006 | Lee et al. | |
| 2001/0055838 A1 | 12/2001 | Walker et al. | |
| 2002/0001219 A1 * | 1/2002 | Forbes et al. | 365/145 |
| 2002/0021587 A1 | 2/2002 | Sakui et al. | |
| 2002/0028541 A1 | 3/2002 | Lee et al. | |
| 2003/0021148 A1 | 1/2003 | Scheuerlein | |
| 2003/0095448 A1 | 5/2003 | Ichige et al. | |
| 2003/0109093 A1 * | 6/2003 | Harari et al. | 438/200 |
| 2003/0128581 A1 | 7/2003 | Scheuerlein et al. | |
| 2003/0155582 A1 | 8/2003 | Mahajani et al. | |
| 2003/0214835 A1 | 11/2003 | Nejad et al. | |
| 2003/0227795 A1 | 12/2003 | Seyyedy et al. | |
| 2004/0002184 A1 | 1/2004 | Cleeves | |
| 2004/0057276 A1 | 3/2004 | Nejad et al. | |
| 2004/0100852 A1 | 5/2004 | Scheuerlein et al. | |
| 2004/0119122 A1 | 6/2004 | Ilkbahar et al. | |
| 2004/0124415 A1 | 7/2004 | Walker et al. | |
| 2004/0124466 A1 | 7/2004 | Walker et al. | |
| 2004/0125629 A1 * | 7/2004 | Scheuerlein et al. | 365/17 |
| 2004/0125653 A1 | 7/2004 | Tran et al. | |
| 2004/0214379 A1 * | 10/2004 | Lee et al. | 438/149 |
| 2005/0018485 A1 * | 1/2005 | Noguchi et al. | 365/185.17 |

FOREIGN PATENT DOCUMENTS

| | | |
|---|---|---|
| EP | 0395886 A2 | 11/1990 |
| EP | 0 528 367 A1 | 2/1993 |
| EP | 0 575 051 A1 | 12/1993 |
| WO | WO0243067 | 5/2002 |

OTHER PUBLICATIONS

Durisety, Chandra Sekhar Acharyulu, "Analysis and Characterization of Single-Poly Floating Gate Devices in 0.35um PDSOI Process," A Thesis Presented for the Master of Science Degree, The University of Tennessee, Knoxville, Dec. 2002, pp. i-viii and 1-80.

Naji, Peter K., et al., "A 256kb 3.0V 1T1MTJ Nonvolatile Magnetoresistive RAM," 2001 IEEE ISSCC, Feb. 6, 2001, Paper 7.6, and associated slide handouts, 35 pages.

Kawagoe, Hiroto, et al., "Minimum Size ROM Structure Compatible with Silicon-Gate E/D MOS LSI," IEEE Journal of Solid-State Circuits, vol. SC-11, No. 3, Jun. 1976, pp. 360-364.

Kim, Byungcheul, et al., "A Scaled SONOS Single-Transistor Memory Cell for a High-Density NOR Structure with Common Source Lines," Journal of the Korean Physical Society, vol. 41, No. 6, Dec. 2002, pp. 945-948.

Kim, Byungcheul, et al., "Single Power Supply Operated and Highly Reliable SONOS EEPROMS," Journal of the Korean Physical Society, vol. 40, No. 4, Apr. 2002, pp. 642-644.

Kim, Kyu-Hyoun, et al., "An 8-Bit-Resolution, 360-μs Write Time Nonvolatile Analog Memory Based on Differentially Balanced Constant-Tunneling-Current Scheme (DBCS)," IEEE Journal of Solid-State Circuits, vol. 33, No. 11, Nov. 1998, pp. 1758-1762.

Lee, Yong Kyu, et al., "Multilevel Vertical-Channel SONOS Nonvolatile Memory on SOI," IEEE Electron Device Letters, vol. 23, No. 11, Nov. 2002, pp. 664-666.

Kitano, Yoshitaka, et al., "A 4-Mbit Full-Wafer ROM," IEEE Journal of Solid-State Circuits, vol. SC-15, No. 4, Aug. 1980, pp. 686-693.

Lin, Horng-Chih, et al., "Ambipolar Schottky-Barrier TFTs," IEEE Transactions on Electron Devices, vol. 49, No. 2, Feb. 2002, pp. 264-270.

Suh, Kang-Deog, et al., "A 3.3 V 32 Mb NAND Flash Memory with Incremental Step Pulse Programming Scheme," IEEE Journal of Solid-State Circuits, vol. 30, No. 11, Nov. 1995, pp. 1149-1156.

Jung, Tae-Sung, et al., "A 117-mm$^2$ 3.3-V Only 128-Mb Multilevel NAND Flash Memory for Mass Storage Applications," IEEE Journal of Solid-State Circuits, vol. 31, No. 11, Nov. 1996, pp. 1575-1583.

Takeuchi, Ken, et al., "A Negative $V_{th}$ Cell Architecture for Highly Scalable, Excellently Noise-Immune, and Highly Reliable NAND Flash Memories," IEEE Journal of Solid-State Circuits, vol. 34, No. 5, May 1999, pp. 675-684.

Nishihara, Toshiyuki, et al., "A Quasi-Matrix Ferroelectric Memory for Future Silicon Storage," IEEE Journal of Solid-State Circuits, vol. 37, No. 11, Nov. 2002, pp. 1479-1484.

Sugibayashi, Tadahiko, et al., "A 30-ns 256-Mb DRAM with a Multidivided Array Structure," IEEE Journal of Solid-State Circuits, vol. 28, No. 11, Nov. 1993, pp. 1092-1098.

Evans, Robert J., et al., "Energy Consumption Modeling and Optimization for SRAM's," IEEE Journal of Solid-State Circuits, vol. 30, No. 5, May 1995, pp. 571-579.

Park, Ki-Tae, "Recent Non-Volatile Memory Device & Circuit Technology," Halo LSI Inc, (date unknown), 35 pages.

Roizin, Yakov, et al., "Plasma-Induced Charging in Two Bit per Cell SONOS Memories," Tower Semiconductor Ltd., Migdal HaEmek 23105, Israel, (date unknown), 4 pages.

Shin, Jongshin, et al., "A New Charge Pump Without Degradation in Threshold Voltage Due to Body Effect," IEEE Journal of Solid-State Circuits, vol. 35, No. 8, Aug. 2000, pp. 1227-1230.

Sturm, J. C., et al., "Leakage Current Modeling of Series-Connected Thin Film Transistors," IEEE Transactions on Electron Devices, vol. 42, No. 8, Aug. 1995, pp. 1561-1563.

Thean, Aaron, et al., "Flash memory: towards single-electronics," IEEE Potentials, Oct./Nov. 2002, pp. 35-41.

U.S. Appl. No. 10/326,470, filed Dec. 19, 2002, entitled "An Improved Method for Making High-Density Nonvolatile Memory," naming inventors S. Brad Herner, Maitreyee Mahajani and Michael A. Vyvoda.

* cited by examiner

CROSS SECTION

LAYOUT

CH5 NOT SHOWN. IT CAN BE SAME SHAPE
AS CH3. ADDITIONAL LAYERS CAN STACK
ON TOP. (EG – CH5/CH6/VIA/CH7 REPEATING
THIS PATTERN.)

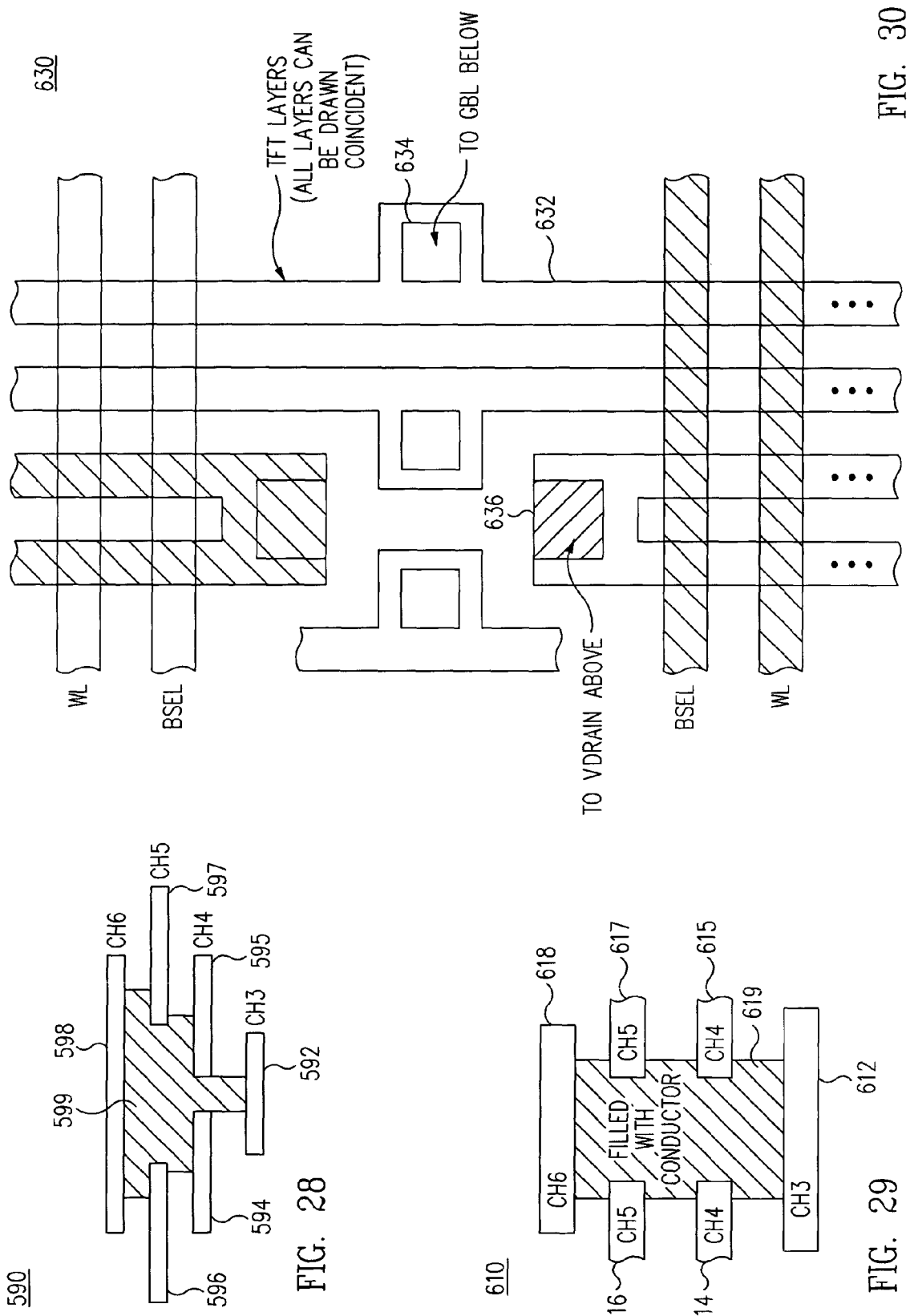

PROGRAMMABLE MEMORY ARRAY STRUCTURE INCORPORATING SERIES-CONNECTED TRANSISTOR STRINGS AND METHODS FOR FABRICATION AND OPERATION OF SAME

CROSS-REFERENCE TO RELATED APPLICATION(S)

This application is related to co-pending U.S. application Ser. No. 10/335,089 by Andrew J. Walker, et al, entitled "Method for Fabricating Programmable Memory Array Structures Incorporating Series-Connected Transistor Strings," filed on even date herewith, which application is hereby incorporated by reference in its entirety.

BACKGROUND

1. Field of the Invention

The present invention relates to semiconductor integrated circuits containing memory arrays, and in preferred embodiments the invention particularly relates to monolithic three-dimensional memory arrays having series-connected memory cells.

2. Description of the Related Art

Recent developments in semiconductor processing technologies and memory cell technologies have continued to increase the density achieved in integrated circuit memory arrays. For example, certain passive element memory cell arrays may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane or level of memory cells have been fabricated implementing such so-called $4F^2$ memory cells on each memory plane. Exemplary three-dimensional memory arrays are described in U.S. Pat. No. 6,034,882 to Johnson, entitled "Vertically Stacked Field Programmable Nonvolatile Memory and Method of Fabrication."

A variety of other memory cells technologies and arrangements are also known. For example, NAND flash and NROM flash EEPROM memory arrays are known to achieve relatively small memory cells. Other small flash EEPROM cells are known which use hot electron programming, such as NROM and floating gate NOR flash memory arrays. Such memory cells are less desirable for a 3D memory because they use many masks to produce a memory layer, and some use relatively high programming currents.

Other known memory structures are taught by U.S. Pat. No. 6,163,048 by R. T. Hirose et al., entitled "Semiconductor Non-volatile Memory Device Having a NAND Cell Structure," which describes a memory array utilizing silicon/oxide/nitride/oxide/silicon (SONOS) cells arranged in a NAND architecture in crystalline silicon. U.S. Pat. No. 6,005,270 by T. Noguchi et al., entitled "Semiconductor Nonvolatile Memory Device and Method of Production of Same," describes a memory array utilizing thin-film transistor (TFT) SONOS cells formed on a low-cost substrate such as glass or plastic. U.S. Pat. No. 5,568,421 by S. Aritome, entitled "Semiconductor Memory Device on which Selective Transistors are Connected to a Plurality of Respective Memory Cell Units," describes a NAND flash memory array having TFT block select devices and bulk silicon flash cell devices. U.S. Pat. No. 5,621,683 by N. D. Young, entitled "Semiconductor Memory with Non-Volatile Memory Transistor," describes a memory array including TFT memory cells of a dielectric storage type arranged in a configuration other than a NAND architecture.

Despite such progress, memory arrays having even greater density are desirable. In particular, a memory array technology easily fashioned into a three-dimensional memory array is highly desired.

SUMMARY

An extremely dense memory array may be achieved by using thin film transistors having a charge storage dielectric, and which are connected in a NAND-style architecture. In an exemplary embodiment, a flash memory array may be formed by series-connected NAND strings of SONOS memory cell devices. Each NAND string of memory cells includes a first block select device which couples one end of the NAND string to a global bit line, and a second block select device which couples the other end of the NAND string to a shared bias node associated with the string. Preferably the block select devices are also SONOS devices and may be formed in an identical fashion as the memory cell transistors, thus reducing the number of different structures necessary for each NAND string.

Pairs of NAND strings within a memory block on a level of the memory array preferably share the same global bit line. Two block select signals for the block are routed to each NAND string. Each of the NAND strings within the block share the same word lines, but their control signals are reversed for the pairs of NAND strings. For example, the first block select signal couples one NAND string to the global bit line and couples the other NAND string to a first shared bias node, while the second block select signal couples the other NAND string to the global bit line and couples the first NAND string to a second shared bias node.

In certain embodiments, the block select devices and the memory cells devices are SONOS devices. A range of threshold voltages is contemplated, but preferably such devices are formed having a depletion mode threshold voltage. Even more preferably the block select devices and the memory cells devices are N-channel devices having a thermal equilibrium threshold voltage of −2 to −3 volts. For the memory cells, such a threshold voltage preferably corresponds to an erased data state, and the memory cells are programmed to a near depletion threshold voltage of from −1 volt to 0 volts. The block select devices are preferably fabricated having the same thermal equilibrium threshold voltage but are maintained in a programmed state having a near depletion mode threshold voltage.

In certain embodiments, a multi-level memory array includes memory cells formed on each of several memory planes or memory levels. NAND strings on more than one layer may be connected to global bit lines on a single layer. Such a global bit line layer is preferably disposed on a layer of a monolithic integrated circuit below all the memory levels for more convenient connection to support circuitry for the memory array, which may be disposed in the substrate below the array. In some embodiments such a global bit line layer may reside in the midst of the memory levels, or above the array. Moreover, the NAND strings on more than one layer may also be connected to shared bias nodes on a single layer, which preferably is disposed above all the memory levels. In some embodiments, the shared bias nodes may reside in the midst of the memory levels, or below the array. The shared bias nodes may likewise be disposed on more than one layer.

The present invention in preferred embodiments achieves a $4F^2$ layout for each memory cell. Moreover, by interleaving the NAND strings on each memory level and using more than one shared bias node per block, very little additional overhead is required for the switch devices at each end of the NAND strings. In certain three-dimensional embodiments the NAND strings on different levels are preferably connected together by way of vertical stacked vias. Each stacked via preferably connects to a channel or word line feature on more than one memory level. The invention is particularly well suited for a three-dimensional memory array because each level of memory cells may be produced with an average of less than three masks per level: one for defining channel stripes on each memory level, another for defining gate stripes on each memory level, and a via mask shared by at least three memory levels. An exemplary eight level memory array may be formed using only 19 masking steps.

In addition to the density achieved, preferred embodiments of the present invention provide a memory array which may be programmed and erased using only tunneling currents, and which does not form leakage paths through non-selected memory cells in the memory array. Consequently, a memory of even greater density may be achieved since the memory array may be sized with relatively little regard for such unwanted leakage currents.

The invention in several aspects is suitable for integrated circuits having a memory array, for memory cell and memory array structures, for methods for operating such integrated circuits and memory arrays, for methods for forming or fabricating such integrated circuits and memory arrays, and for computer readable media encodings of such integrated circuits or memory arrays, all as described herein in greater detail and as set forth in the appended claims.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 28 is a cross-sectional view of a via structure (i.e., a "zia") making contact to four channel string layers of a multi-level memory array, in accordance with various embodiments of the present invention.

FIG. 29 is a cross-sectional view of a chimney-like via structure (i.e., a "zia") making contact to four channel string layers of a multi-level memory array, in accordance with various embodiments of the present invention.

FIG. 30 is a layout diagram of a multi-level 2:1 interleaved NAND string memory array structure which might include zias as depicted in FIG. 29.

The use of the same reference symbols in different drawings indicates similar or identical items.

DESCRIPTION OF THE PREFERRED EMBODIMENT(S)

As used herein, an integrated circuit having a three-dimensional memory array is assumed to be a monolithic integrated circuit, rather than an assembly of more than one monolithic integrated circuit.

Figure 1:
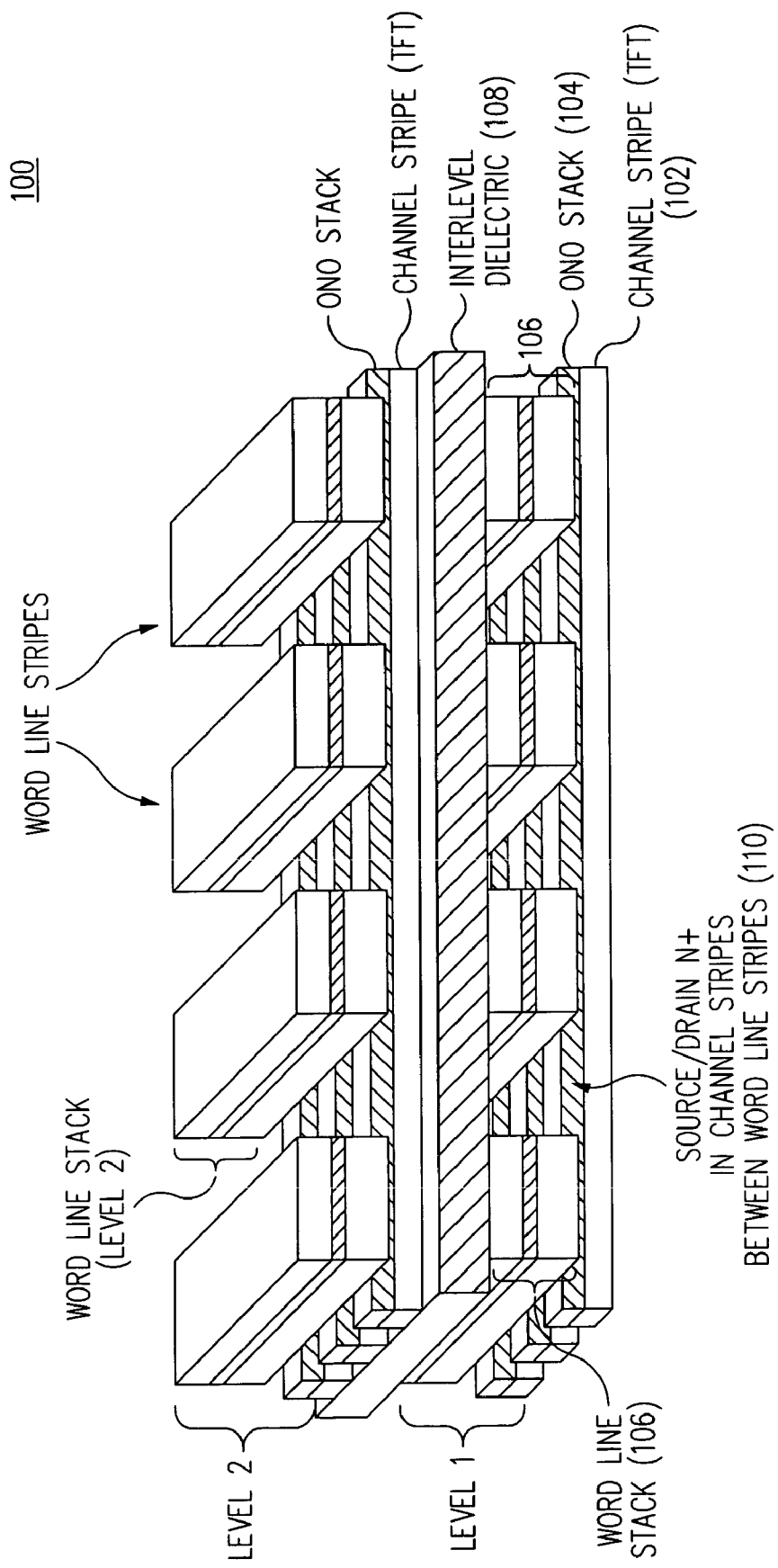
FIG. 1 is a perspective view of a multi-level array structure in accordance with an embodiment of the present invention, showing series-connected NAND strings.

Referring now to FIG. 1, a three-dimensional view is shown conceptually depicting a portion of a two-level memory array 100 in accordance with the present invention. On level 1, a plurality of channel stripes (e.g., 102) is formed in a first direction. A stored charge dielectric layer 104, such as an oxide/nitride/oxide (ONO) stack, is formed at least on the top surface of the channel stripes 102. A plurality of gate stripes (e.g., 106) running in a second direction different than the first direction is formed on the stored charge dielectric layer 104. Preferably the gate stripes, also called word line stripes, run generally orthogonally to the channel stripes. A source/drain region (e.g., 110) is formed in the channel stripes in the exposed regions between the word line stripes (i.e., not covered by a word line stripe), thus forming a series-connected string of thin-film transistors (TFT).

Such channel stripes 102 are preferably formed by depositing a polycrystalline polysilicon layer and etching the layer using a channel mask to form the channel stripes. The word line stripes 106 may be formed of a stack of more than one layer, such as a polysilicon layer covered by a silicide layer, or may be a three level stack, as shown in the figure, all as described in greater detail herebelow.

An interlevel dielectric layer 108 is formed above the word line stripes to isolate the word lines on one level (e.g., word line stripes 106 depicted on level 1) from the channel stripes on the next higher level (e.g., channel stripes 102 depicted on level 2). As is described in greater detail below, a dielectric may also be used to fill spaces between the word line stripes of a given level.

Figure 2:
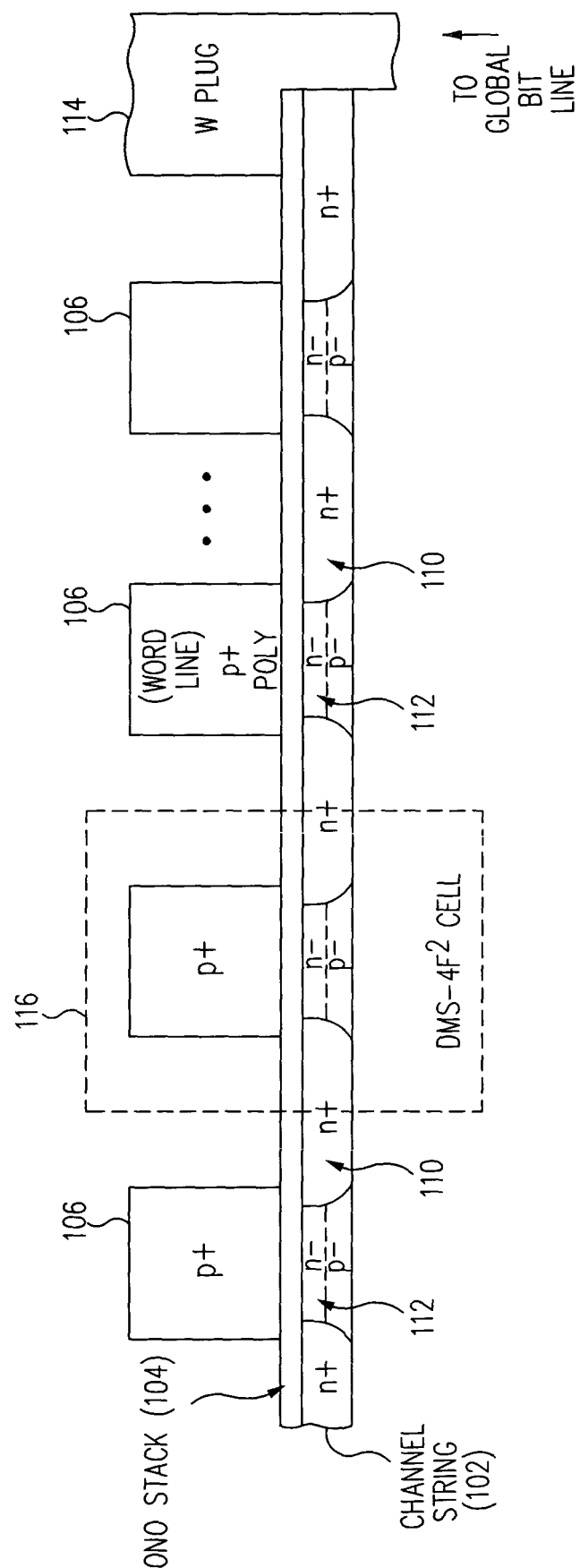
FIG. 2 is a cross-sectional view of a similar structure to that shown in FIG. 1.

As can be appreciated, such a structure forms a plurality of series-connected transistors within each channel stripe 102. FIG. 2 shows a cross-sectional view of such a plurality of series-connected transistors, which may also be referred to as a series-connected transistor string, and also as a series-connected NAND string. Four word lines 106 are shown, forming four individual transistors connected in series along the channel stripe 102. In this example, the channel stripe 102 is formed from a lightly-doped p-type (i.e., P– doped) polycrystalline layer, and includes a heavily-doped n-type (i.e., N+ doped) source/drain region 110 formed in the channel stripe 102 between the word lines 106. The channel region of each respective transistor is formed in the channel stripe 102 beneath the respective word line 106, and preferably includes a channel dopant region 112 to adjust the transistor threshold, lying above a P– region of the channel stripe 102. A via 114 is depicted connected to one end of the channel stripe 102 for making connections to support circuitry for the array, as described in greater detail herebelow.

The transistors of such a NAND string may be fabricated to contain enhancement or depletion mode devices for the programmed state. In other types of NAND memory arrays using floating gate devices (rather than SONOS devices), the erased state is often a zero-volt threshold voltage ($V_T$) or even a depletion mode $V_T$. But a floating gate device can have a wide range of $V_T$'s because the floating gate can store a wide range of charge levels. Consequently, it is more straightforward to make a depletion mode programmed state, as is described in "A Negative Vth Cell Architecture for Highly Scalable, Excellently Noise-Immune, and Highly Reliable NAND Flash Memories" by Takeuchi et al., in IEEE JSSC, Vol. 34, No. 5, May 1999, pp. 675-684. Achieving such a depletion mode erased state has not been done before in a NAND array incorporating SONOS devices.

For many memory arrays, and especially for a three-dimensional (3D) memory, utilizing depletion mode devices when erased and near depletion mode devices (i.e., around zero volt $V_T$) when programmed has a great advantage in simplifying the layout complexity for each of the memory layers, as described herebelow. Moreover, utilizing near depletion mode devices when programmed reduces the voltages that need to be applied to the unselected word lines when reading a selected memory cell. The cell current can pass more easily through the string even if unselected memory cells are programmed. This voltage reduction is beneficial for reducing disturb effects during the many expected read cycles. For example, an unselected memory cell on an unselected NAND string which is erased could be slowly disturbed to a programmed state by higher voltages on the word lines.

The memory structure of FIG. 2 may be fabricated using only two masking layers per memory level-one to define the channel stripes, and another to define the word line stripes. As is described herebelow, a third mask for contacting the layers of the memory level is not necessarily required, as contact structures may be incorporated that achieve electrical connection to at least three layers using a single via mask.

Figure 3:
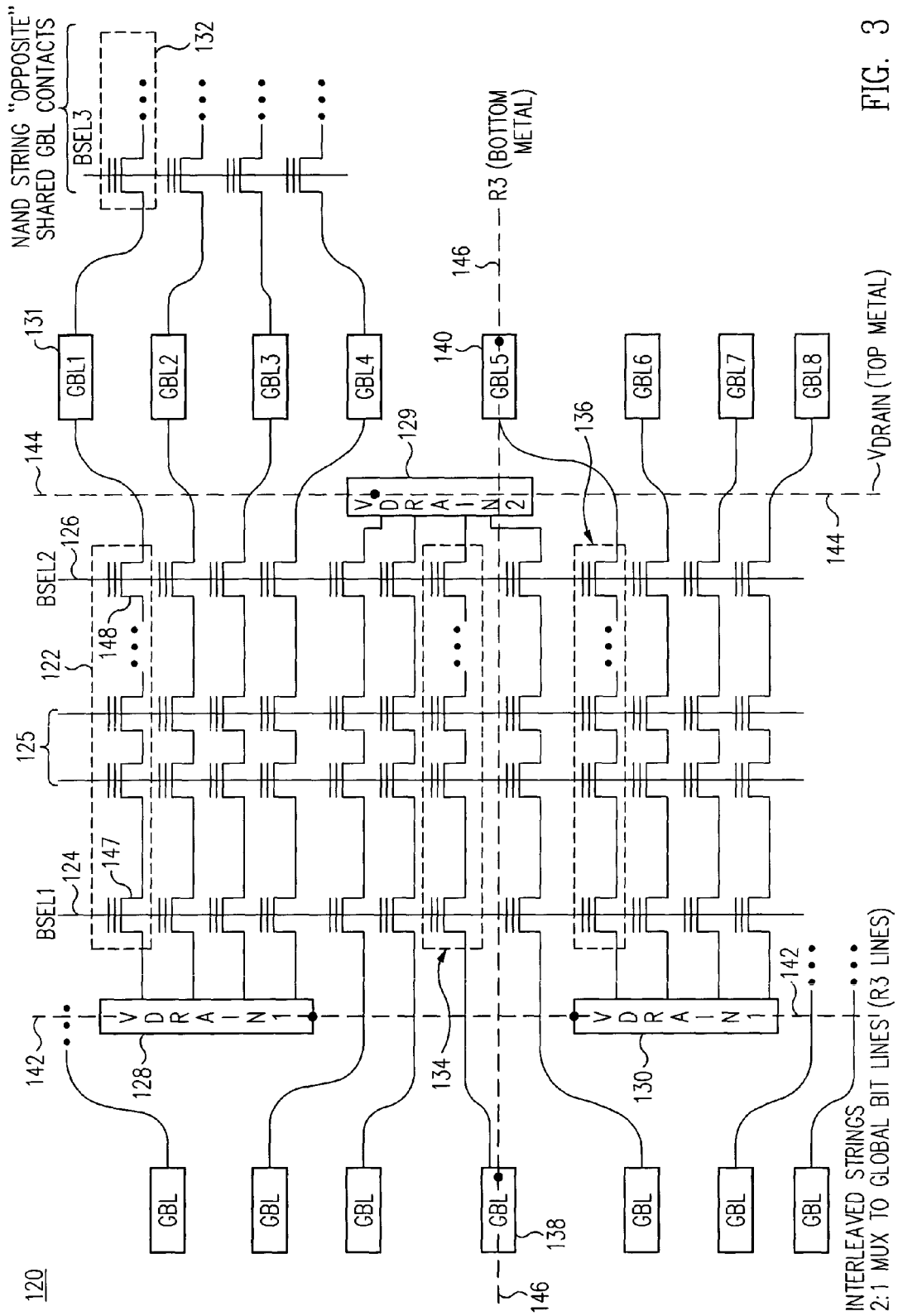
FIG. 3 is a schematic diagram of a 4:1 interleaved NAND string structure in accordance with an embodiment of the present invention.

Referring now to FIG. 3, an electrical schematic is shown of a portion of an exemplary memory array. The portion shown may represent a two-dimensional array having only one plane of memory cells, or may represent one level of three-dimensional memory array having more than one level (i.e., more than one plane) of memory cells. A plurality of series-connected NAND transistor strings is shown, one of which is labeled 122. Each string includes a plurality of SONOS transistors connected in series, each gated by a respective one of a plurality of word lines 125. The NAND string 122 also includes a block select device 148 for coupling one end of the NAND string to a global bit line contact 131 in accordance with a block select signal BSEL2 conveyed on node 126, and further includes a second block select device 147 for coupling the other end of the NAND string to a shared bias node 128 in accordance with a block select signal BSEL1 conveyed on node 124. The global bit line contact 131 is shared with another NAND string 132 which is disposed on the other side of (i.e., opposite) the global bit line contact 131 and is independently selectable by another block select signal BSEL3.

As is depicted in the figure, a group of four laterally adjacent NAND strings share a common bias node 128, which may be termed VDRAIN1, disposed at the left end of the NAND strings, but are individually coupled to a respective one of four global bit line contacts disposed at the right end of the NAND string. The next group of four laterally adjacent NAND strings is reversed, and the NAND strings in the group are individually coupled to a respective one of four global bit line contacts disposed at the left end of the NAND strings. This next group of NAND strings shares a common bias node 129, which may be termed VDRAIN2, disposed at the right end of the NAND strings. As may be appreciated, the block select signal BSEL1 couples the left end of half of the NAND strings to an associated global bit line, while the same signal couples the right end of the other half of the NAND strings to the shared bias node VDRAIN1. Similarly, block select signal BSEL2 couples the right end of half of the NAND strings to an associated global bit line, while the same signal couples the right end of the other half of the NAND strings to the shared bias node VDRAIN2.

This structure interleaves the NAND strings by coupling two different NAND strings to the same global bit line. For example, the left end of NAND string 134 is coupled by BSEL1 to a global bit line contact 138, while the right end of NAND string 136 is coupled by BSEL2 to a global bit line contact 140. These two global bit line contacts 138 and 140 are preferably connected to the same global bit line, which may be routed horizontally on a wire 146 conveyed on a different wiring level. Such global bit lines may be conveyed a wiring level below the array, or alternatively above the array, or alternatively on a wiring level within the array (e.g., in a three-dimensional array having more than one level). The NAND string 134 and 136 may be referred to as "adjacent" NAND strings, as sharing the same global bit line and sharing the same word lines (i.e., within the same block of the array), even though there is another NAND string disposed between them. It is still possible to select only one of these two NAND strings for reading and writing because the shared bias nodes VDRAIN1 and VDRAIN2 are distinct and may be driven to different conditions, as is described in regards to the next several figures. Each of these two shared bias nodes VDRAIN1 and VDRAIN2 is shared by NAND strings in two adjacent blocks, and thus are preferably conveyed in vertical wires 142 and 144, respectively, which are preferably conveyed on a wiring level "above" the memory array (i.e., further from the semiconductor substrate). Consequently, the two shared bias nodes VDRAIN1 and VDRAIN2, the block select signals BSEL1 and BSEL2, and the various word lines 125, which all traverse across the memory array in the same direction, may be more conveniently decoded and driven to appropriate levels.

As described above, the memory cells in the NAND strings (i.e., those gated by one of the word lines) are preferably SONOS structures. As used herein, the term SONOS is meant to refer to the general class of transistor devices having a charge storage dielectric layer between the gate and the underlying channel, and is not used in a restrictive sense to merely imply a literal silicon-oxide-nitride-oxide-silicon layer stack. For example, other kinds of dielectric layers may be employed, such as oxynitrides, as is described in greater detail herebelow.

A basic NAND string is a very efficient structure, capable of achieving a 4F$^2$ layout for the incremental transistor memory cell. However, providing the necessary switch devices with appropriate control signals at the ends of the NAND strings, and the overhead of connecting such NAND strings to global bit lines and to bias or ground nodes, frequently degrades the resultant total efficiency. In contrast, the structure depicted in FIG. 3 achieves very dense layout because of the interleaving of two NAND strings, both coupled to the same global bit line, thus relaxing the pitch requirements for the global bit lines by a factor of two. The structure depicted in FIG. 3 also achieves very dense layout because only one control signal is utilized at each end of the NAND strings. This allows the two block select lines BSEL1 and BSEL2 to route in continuous polysilicon stripes across the plurality of channel stripes, just like the word lines, without any provision being otherwise required for contacting a block select signal line to some but not all of the block select transistors formed in the channel stripes.

Another factor contributing to the efficiency of this array structure is the ability of the block select devices to be fabricated identically to the memory cell devices. In other words, the block select devices may be SONOS devices just like the memory cell devices. In 3D array embodiments having more than one memory level formed above a semiconductor substrate, each memory level consequently includes only one type of device, further simplifying the fabrication of each level. The block select devices may be sized identically to the memory cell devices, but preferably may have a longer channel length (i.e., wider polysilicon stripe for the block select signals) to increase the breakdown voltage of the block select devices.

In a preferred embodiment, the memory cell devices and block select devices are both SONOS devices which are implanted to shift the thermal equilibrium (i.e., minimum trapped charge in the nitride) threshold voltage $V_T$ to depletion mode. A depletion mode implant that is a slow diffuser, preferably antimony or arsenic, is preferably used because of the relatively higher diffusion of such dopants in a polycrystalline layer compared with a crystalline substrate, and also due to the extremely small dimensions of the devices. The erased state $V_T$ is substantially depletion mode, preferably −2V to −3V threshold, while the programmed state $V_T$ is preferable about zero volts. The memory cells are programmed or erased to one of the two threshold voltages according to the data state, but the block select devices are preferably programmed to have about a zero-volt threshold voltage and maintained in this programmed state.

Figure 4:
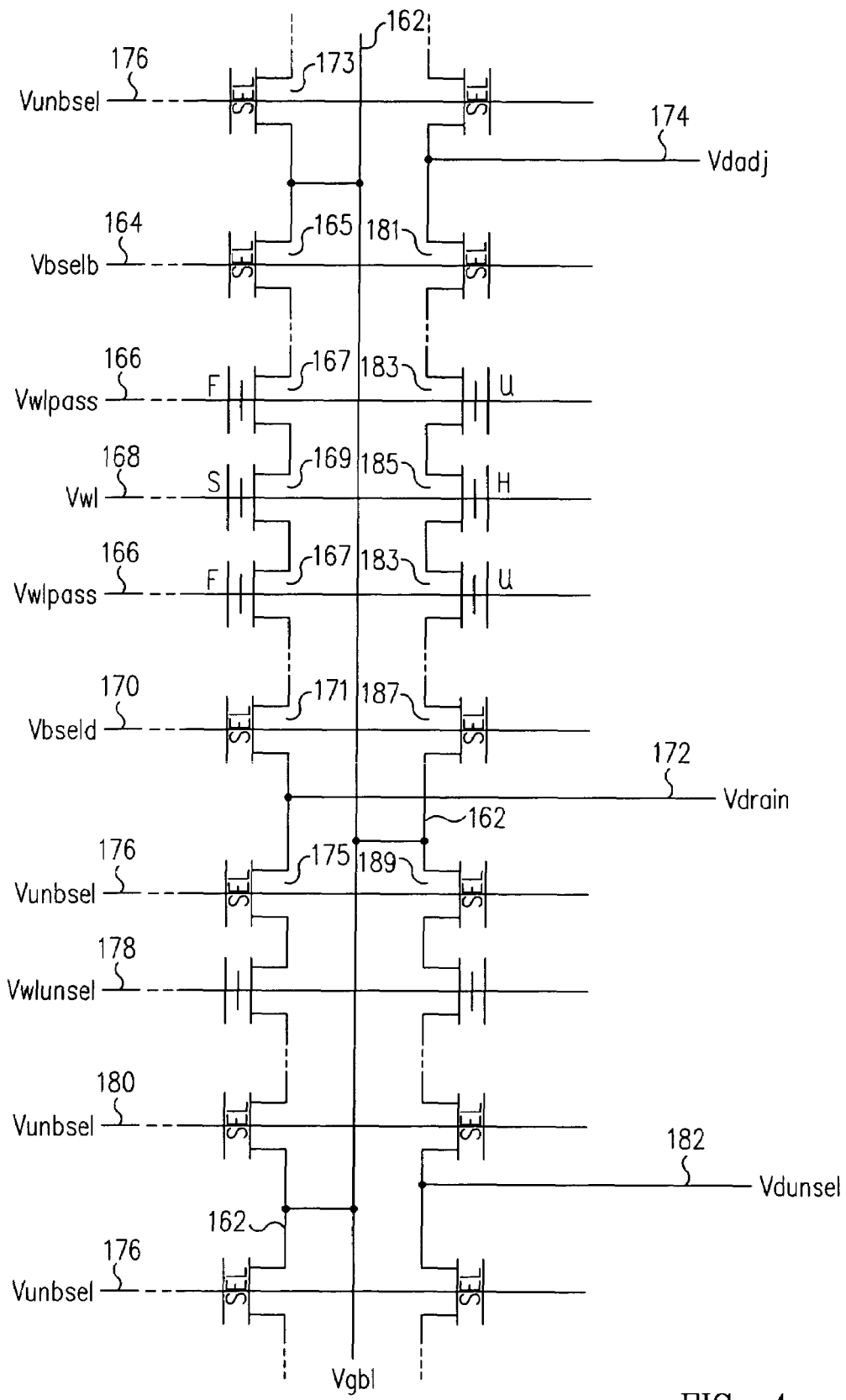
FIG. 4 is a schematic diagram of a several NAND strings within a memory level, in accordance with an embodiment of the present invention.

Referring now to FIG. 4, a schematic diagram is introduced showing two different NAND strings in each of two blocks which may be coupled to the same global bit line. The terminology and structure described here is used in the next several figures to describe the basic read, program, and erase functions for such an array configuration. The portion shown may represent a two-dimensional array having only one plane of memory cells, or may represent one level of three-dimensional memory array having more than one level of memory cells. The basic operation will be described in the context of a single memory level and also for a multi-level array.

In the descriptions that follow, the upper left NAND string is assumed to be the selected NAND string. The selected word line 168 is driven to a $V_{WL}$ voltage, and the selected memory cell 169 is indicated by an "S." Other non-selected word lines 166 in the same block as the selected word line 168 may be termed "passing" word lines because these are usually driven to a $V_{WLPASS}$ voltage suitable to pass current through its respective memory cell 167 irrespective of the stored data state in its respective memory cell 167. Only two such passing word lines 166 and one selected word line 168 are depicted, but it should be appreciated that in practice each NAND string may include many word lines, such as 16 total word lines.

One end of the selected NAND string is coupled to a global bit line 162 by select device 165 which is controlled by a block select signal conveyed on node 164 having a voltage at any given time known as the $V_{BSELB}$ voltage, which signal may be thought of as the block select signal coupling the selected NAND string to the global bit line. The other end of the selected NAND string is coupled to a shared bias node 172 by select device 171 which is controlled by a block select signal conveyed on node 170 having a voltage of $V_{BSELD}$, which signal may be thought of as the block select signal coupling the selected NAND string to the shared drain line. The voltage of the shared drain line 172 may be known as the $V_{DRAIN}$ voltage.

Another NAND string (not shown) within the block just above the selected block is also coupled to the global bit line 162 by a select device 173 which is controlled by a block select signal conveyed on node 176 having a voltage at any given time known as the $V_{UNBSEL}$ voltage, which signal may be thought of as an unselected block select signal. The two select devices 173 and 165 preferably share a global bit line contact.

An adjacent NAND string is also depicted just to the right of the selected NAND string. As stated above, such adjacent NAND strings share the same word lines and are coupled to the same global bit line (i.e., by two different block selected signals), but do not share the same shared bias node (i.e., "drain" node). Here the adjacent NAND string includes devices 181, 183, 185, and 187. The lower end of this adjacent NAND string is coupled to the global bit line 162 by select device 187 which is controlled by the block select signal conveyed on node 170, here referred to as $V_{BSELD}$. The upper end of this adjacent NAND string is coupled to a shared bias node 174 by select device 181 which is controlled by the block select signal conveyed on node 164, $V_{BSELB}$. The voltage of the shared drain line 174 may be known as the VDADJ voltage, representing the drain voltage for an adjacent NAND string.

The memory cell devices in the adjacent NAND string merit brief mention, for their respective bias conditions in the various operating modes are important. Two memory cell devices labeled 183 are driven by a passing word line 166 and may be termed unselected memory cells (labeled with a "U"). Another memory cell device 185 is driven by the selected word line 168 and may be termed a half selected memory cell (labeled with an "H"). Such unselected and half-selected memory cells are found in other non-selected NAND strings across the selected memory block.

In the lower half of the figure, two additional NAND strings are also depicted which are located in the block just below the selected array block. Both of these NAND strings are unselected. The block select line 176 at end of both NAND strings and the other block select line 180 at the other end of the NAND strings are both biased at an unselected block select voltage, $V_{UNBSEL}$. An unselected word line 178 (representing the plurality of word lines in the unselected block) is biased at an unselected word line voltage, $V_{WLUNSEL}$. An unselected shared drain node 182 is shown, having a bias voltage of $V_{DUNSEL}$. Such a shared drain node is representative of any such drain node serving two unselected blocks.

These two lower NAND strings also represent the bias voltages impressed on the various nodes and devices within other non-selected blocks on the same level as the selected block. For certain three-dimensional array embodiments shown herein, these two lower NAND strings also represent the bias voltages impressed on the various nodes and devices within all blocks on the non-selected levels in the array.

Block select devices 187 and 189 share a contact to global bit line 162. Similarly, a shared bias node (i.e., VDRAIN) contact is also shared by a respective block select device on opposite sides of the shared contact (e.g., select devices 171 and 175). Moreover, as depicted in FIG. 3, four NAND strings within the same block share such a VDRAIN contact (although each is coupled to a respective global bit line) for a total of eight NAND strings on a given layer sharing each VDRAIN contact.

Read Operation

Figures 5, 6:
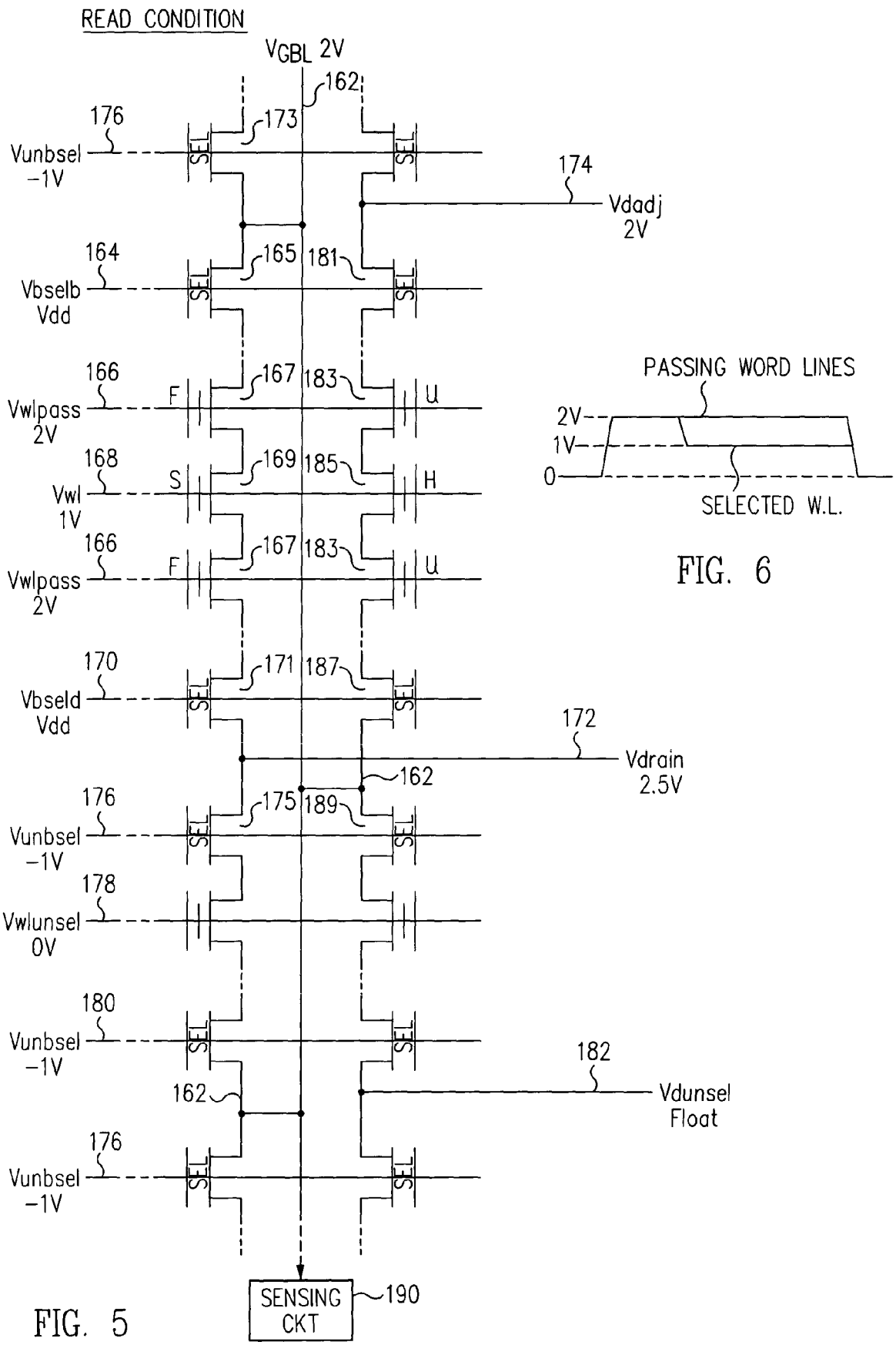
FIG. 5 is a schematic diagram as in FIG. 4, showing exemplary read conditions for an embodiment of the present invention.
FIG. 6 is a diagram depicting exemplary waveforms for the exemplary read conditions of FIG. 5.

Referring now to FIG. 5, exemplary read conditions are shown for this array structure. The selected NAND string is read by impressing a voltage across the NAND string, ensuring that both block select devices are biased to pass a current, ensuring that all non-selected memory cell devices in the NAND string are biased to pass a current through the string irrespective of the data state stored therein, and biasing the selected word line so that current flows through the NAND string for only one of the two data states. One suitable set of read conditions includes driving the "global bit line" block select line $V_{BSELB}$ to a positive power supply voltage $V_{DD}$ (e.g., $V_{DD}$ frequently being in the range from 2.5 to 3.3 volts) and driving the "drain" block select line $V_{BSELD}$ also to $V_{DD}$. The voltage of the global bit line 162 (i.e., $V_{GBL}$) is approximately 2 volts, and $V_{DRAIN}$ is approximately 2.5 volts. The data state of the selected memory cell may be determined by maintaining the voltage bias on the global bit line and sensing current flow on the global bit line by a sensing circuit 190, which may be either directly coupled to the global bit line or may be shared among several global bit lines and coupled by decoding circuitry to a desired global bit line. Suitable voltage-clamped bit line sensing circuits are described in "Current Sensing Method and Apparatus Particularly Useful for a Memory Array of Cells Having Diode-Like Characteristics" by Roy E. Scheuerlein, U.S. application Ser. No. 09/896,468, filed Jun. 29, 2001, which application is hereby incorporated by reference in its entirety.

Referring briefly to FIG. 6, all the word lines in the selected block are driven to approximately 2 volts to charge the intermediate nodes of the selected NAND string (i.e., the source/drain regions between each device) to a voltage having a value between the $V_{GBL}$ voltage and the $V_{DRAIN}$ voltage. Then the selected word line is decreased to approximately 1 volt so that current will still flow through the selected device 169 if erased (i.e., having a threshold of around −2 volts) and yet will prevent current flow if the selected device 166 is programmed (i.e., having a threshold of around 0 volts).

The $V_{DADJ}$ voltage is preferably driven to substantially the same voltage as the $V_{GBL}$ voltage, so that substantially no bias voltage is impressed across the adjacent NAND string. Consequently, even though its block select devices 181 and 187 are turned on, no current flows through the adjacent NAND string onto the global bit line 162 which would interfere with sensing the current on the global bit line 162. The intermediate nodes in the adjacent NAND string are all biased at approximately 2 volts since only the selected word line 168 is at a voltage lower than 2 volts, and since every memory cell and block select device has a threshold no higher than approximately 0 volts. As a result, the read disturb condition on the unselected devices 183 (i.e., the bias voltage from gate to source/drain) is essentially zero, and read disturb condition for the half selected cell 185 is approximately −1 volt. Looking back to the selected NAND string, since the intermediate nodes in the selected NAND string are each biased at a voltage between 2 and 2.5 volts, the read disturb condition on the "F" devices 167 is approximately 0-0.5, and the read disturb bias on the selected device 169 is approximately −1 volt. These read disturb conditions, and the relative length of time a memory cell is exposed to such condition, are summarized in Table 1.

TABLE 1

READ DISTURB STRESS VOLTAGE AND TIME

| CELL | VGS | STRESS CONDITION |
|---|---|---|
| S | −1.0 v | Basic read stress time |
| F | 0 to .5 v | More often by # cells in string |
| H | −1.0 v | More often than basic by $\frac{\text{\#unselectBLS}}{\text{selectedBLS}}$ |
| U | 0 | More often by both factors |

The read condition has very low gate-to-source bias voltages impressed across the selected memory cell device because the threshold voltage of an erased cell has been shifted to approximately −2 volts. As a result, a −1 volt gate-to-source voltage is sufficient to cause conduction through the transistor for the erased state but not for the programmed state, and thus allows discerning the data state of the cell. Moreover, the depletion mode erased state allows all four memory cell devices (i.e., S, F, H, and U) to have very low read disturb bias, but is particularly important for the unselected "U" devices to have virtually no read disturb bias voltage, as a given memory cell must endure many more cycles biased as a "U" device than any other bias condition.

The NAND strings in the unselected blocks are de-coupled from the global bit lines by ensuring that the respective block select devices, such as devices 173 and 189, remain off. Likewise, the NAND strings in the unselected blocks are de-coupled from the VDRAIN nodes by ensuring that the respective block select devices, such as device 175, also remain off. This may be achieved by driving $V_{UNBSEL}$ to a voltage such as −1 volts, as shown. All the word lines 178 in the unselected blocks may be conveniently maintained at a $V_{WLUNSEL}$ voltage of ground.

Suitable ranges for each of the voltages described above are summarized in the following Table 2.

TABLE 2

Read Conditions

| Signal | Range |
|---|---|
| $V_{WL}$ | 1 V … 1.5 V |
| $V_{WLPASS}$ | 2 V … 2.5 V |
| $V_{WLUNSEL}$ | 0 V |
| $V_{BSELB}$ | $V_{DD}$ |
| $V_{BSELD}$ | $V_{DD}$ |
| $V_{UNBSEL}$ | −3 V … 0 V |
| $V_{GBL}$ | 1.5 V … 2.5 V |
| $V_{DADJ}$ | 2 V … 3 V |
| $V_{DRAIN}$ | 1.5 V … 2.5 V |
| $V_{DUNSEL}$ | Float |

Program Operation

Figures 7, 8:
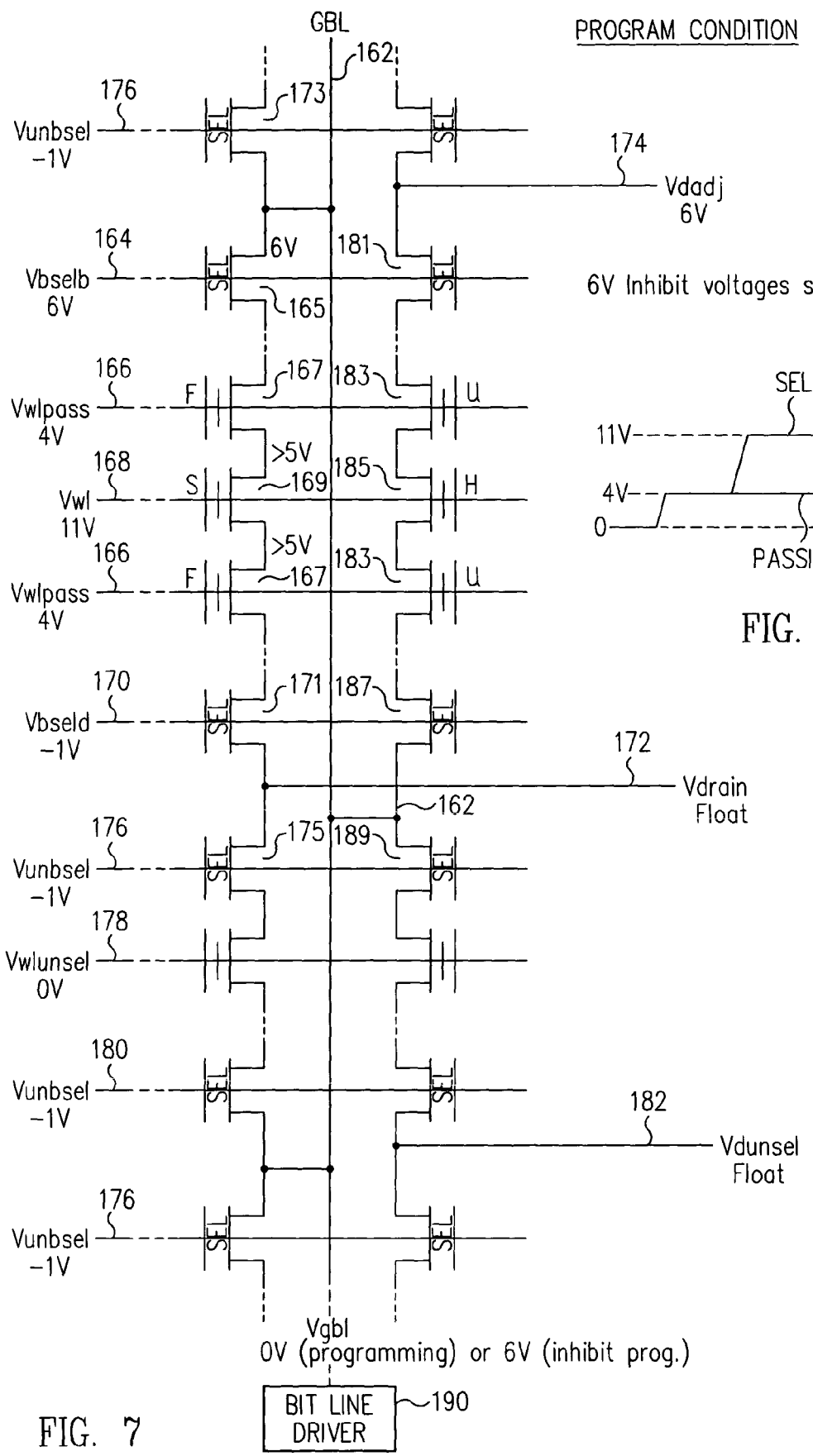
FIG. 7 is a schematic diagram as in FIG. 4, showing exemplary program conditions for an embodiment of the present invention.
FIG. 8 is a diagram depicting exemplary waveforms for the exemplary program conditions of FIG. 7.

Referring now to FIG. 7, exemplary programming conditions are shown for this array structure. The selected memory cell device 169 in the selected NAND string is programmed by impressing a sufficiently high programming voltage (i.e., from gate-to-source) across the selected memory cell.

This may be accomplished by ensuring that the block select device is turned on to pass a low voltage from the global bit line 162 to the NAND string, and impressing a sufficiently high programming voltage on the selected word line 168. The passing word lines are driven to a high enough voltage to convey a low voltage on the global bit line to the selected memory cell device, but not high enough to unintentionally program the non-selected memory cells in the selected NAND string. To inhibit programming, the global bit line may be taken to a much higher voltage so that the gate-to-source voltage impressed across the selected memory cell is less than that necessary to program the device. The passing word line voltage should be high enough to convey the bit line inhibit voltage to the selected memory cell device, as well. One suitable set of program conditions includes driving the "global bit line" block select line $V_{BSELB}$ to approximately 6 volts, and driving the "drain" block select line $V_{BSELD}$ to approximately −1 volts, thus leaving the drain block select device 171 turned off. The $V_{DRAIN}$ shared bias node is preferably left floating. The voltage of the global bit line 162 (i.e., $V_{GBL}$) is driven to approximately 0 volts to program, and driven alternatively to an inhibit voltage of approximately 6 volts to inhibit programming. The passing word line voltage $V_{WLPASS}$ is approximately 4 volts so that at least most of the bit line inhibit voltage (i.e., at least approximately 5 volts) may be passed to the intermediate nodes in the selected NAND string. The voltage on the global bit line may be driven by a bit line driver circuit 190, which may be either directly coupled to the global bit line or may be shared among several global bit lines and coupled by decoding circuitry to a desired global bit line. Suitable driver and decoder circuits are well known in the art.

Referring briefly to FIG. 8, all the word lines in the selected block are driven to the $V_{WLPASS}$ voltage (e.g., approximately 4 volts) to charge the intermediate nodes of the selected NAND string to a voltage at least close to the bit line inhibit voltage. Then the selected word line voltage $V_{WL}$ is increased to a word line programming voltage of, for example, approximately 11 volts. If the $V_{GBL}$ is 0, then substantially 11 volts is impressed across the selected memory cell device 169. Alternatively, if the $V_{GBL}$ is driven to the inhibit voltage of, for example, approximately 6 volts, then only 5 volts is impressed across the selected memory cell device 169 and programming does not occur. Some coupling may occur from the selected word line to source/drain nodes near the selected word line, and result in a slightly less bias voltage during inhibit. Alternatively, the word lines may be driven to a voltage above the inhibit programming voltage while all the global bit lines and the $V_{DADJ}$ are biased at the inhibit programming voltage to pass the full inhibit voltage to the drains within the NAND strings. Then, the selected word line may be driven upward to the programming voltage and the passing word lines reduced down to the passing word line voltage before the selected global bit lines are brought to ground. This achieves greater disturb protection at the expense of more complex operation.

The $V_{DADJ}$ voltage is preferably driven to substantially the same voltage as the bit line inhibit voltage, so that the adjacent NAND string is biased in a similar inhibit condition as described above for the selected NAND string. The intermediate nodes in the adjacent NAND string are all biased at least at approximately 5 volts since every memory cell has a threshold voltage no higher than approximately 0 volts. As a result, the program disturb condition on the unselected devices 183 is approximately in a range from −1 volt to zero (depending upon the exact S/D voltage for a given device), and the program disturb condition for the half selected cell 185 is approximately 5-6 volts. Looking back to the selected NAND string, the program disturb condition on the "F" devices 167 is approximately 4 volts (the $V_{WLPASS}$ voltage). These program disturb conditions, and the relative length of time a memory cell is exposed to such condition, are summarized in Table 3. The programming time (i.e., duration of time that the $V_{WL}$ is driven to the word line programming voltage of, for example, 11 volts) may fall in the range from 1 to several tens of microseconds.

TABLE 3

PROGRAM DISTURB STRESS VOLTAGE AND TIME

| CELL | VGS Voltage | STRESS TIME |
|---|---|---|
| H | 5 v | Shortest (e.g., typically ms) |
| F | 4 v | Medium (e.g., several ms) |
| U | −2 to 0 v | Longest (e.g., tens of ms) |

The block select device 171, on the drain end of the selected NAND string, is turned off during programming to avoid a leakage path through the selected NAND string that would pull $V_{DRAIN}$ (node 172) to a data dependent state. Some strings might pull it high and some strings pull it low, obviously wasting power and potentially interfering with circuit operation.

The block select devices 171 and 187 have to be off by a slightly negative gate voltage (e.g., by a $V_{BSELD}$ voltage of around −1 volts), and the S/D of the device would be at about 6 volts, in at least the adjacent strings and at some of the selected global bit lines. This puts a partial erase bias of approximately −7 volts gate-to-source on the block select device. If these block select devices are formed by the same process steps as the cell, these block select devices can get partially "erased" by this bias voltage applied during programming of a selected memory cell, which would slowly decrease the $V_T$ of the block select devices into a negative region after a number of program cycles. Such a threshold voltage would prevent the block select device from being turned off with only a $V_{BSELD}$ voltage of around −1 volts.

One could use extra processing to remove the charge storage dielectric layer (e.g., nitride) from the block select devices, but this adds complexity to the semiconductor process. Alternatively, a post-programming biasing condition is preferably added at the end of each program cycle, where the affected block select device is "programmed" a small amount to bring its $V_T$ back up to its maximum of, for example, about 0 volts. This may be accomplished by returning all the word lines in the selected block ($V_{WL}$ and $V_{WLPASS}$) back to ground (0 volts), taking the $V_{GBL}$ and $V_{DRAIN}$ to ground, and driving the $V_{BSELD}$ to the programming voltage (e.g., about 10-11 volts) for a short time. For convenience, both block select signals may be driven to the programming voltage as there is little concern for over-programming the threshold of the block select devices. For an exemplary SONOS process described herebelow, the erase time is much longer than the programming time, so that even a relatively short "block select $V_T$ adjust program time" is adequate to ensure that its $V_T$ stays at its maximum. An exemplary duration of time for such a block select $V_T$ adjust is approximately 1 μs.

Suitable ranges for each of the voltages described above are summarized in the following Table 4.

TABLE 4

Program Conditions

| Signal | Range |
|---|---|
| $V_{WL}$ | 7 V ... 15 V |
| $V_{WLPASS}$ | 2 V ... 9 V |
| $V_{WLUNSEL}$ | Ground |
| $V_{BSELB}$ | 4 V ... 10 V |
| $V_{BSELD}$ | −3 V ... 0 V |

TABLE 4-continued

Program Conditions

| Signal | Range |
|---|---|
| $V_{UNBSEL}$ | −3 V ... 0 V |
| $V_{GBL}$ | 0 V/4 V ... 10 V |
| $V_{DADJ}$ | 4 V ... 10 V |
| $V_{DRAIN}$ | Float |
| $V_{DUNSEL}$ | Float |

Erase Operation

Figure 9:
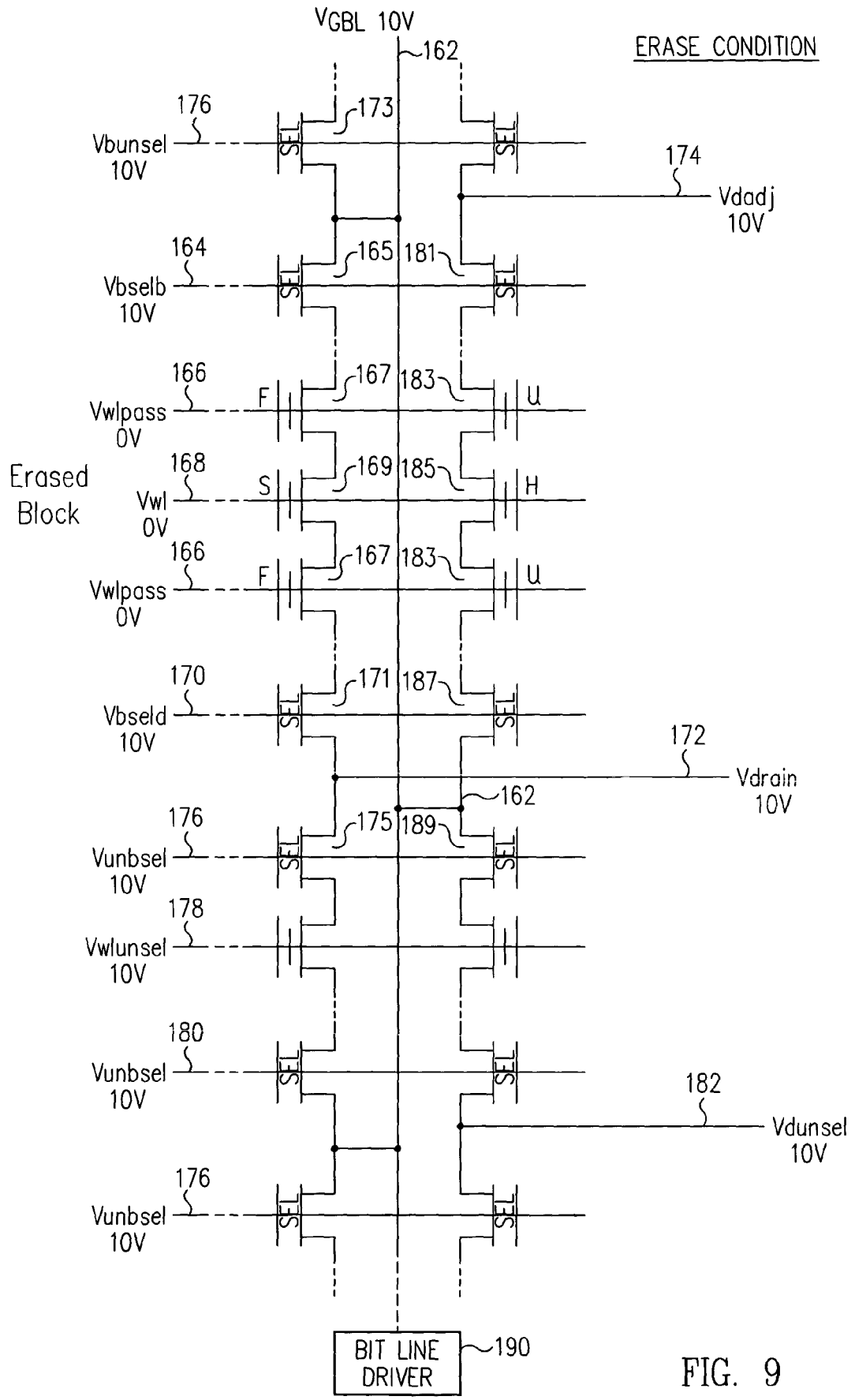
FIG. 9 is a schematic diagram as in FIG. 4, showing exemplary erase conditions for an embodiment of the present invention.
Figure 10:
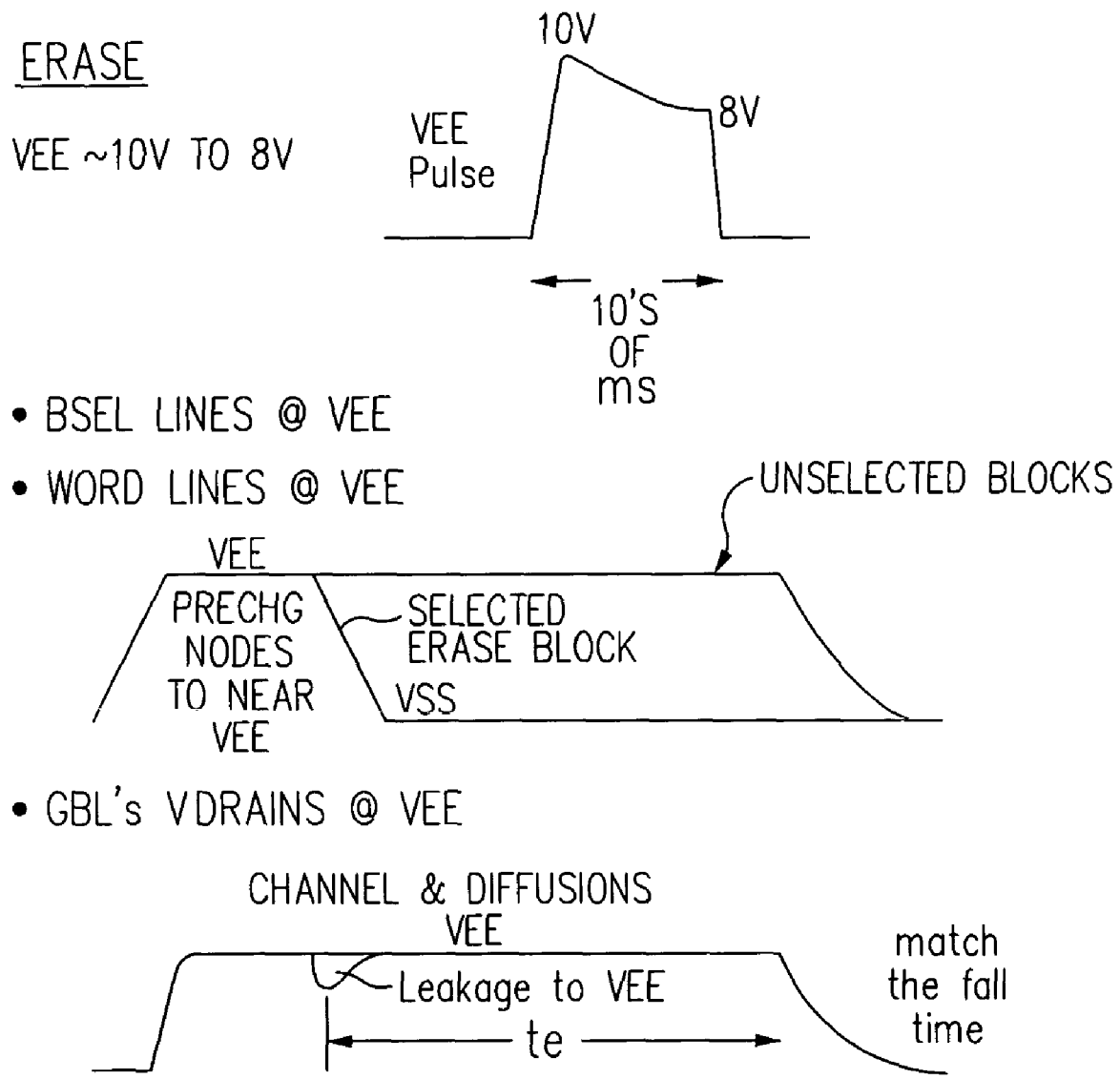
FIG. 10 is a diagram depicting exemplary waveforms for the exemplary erase conditions of FIG. 9.

Referring now to FIG. 9, exemplary erase conditions are shown for this array structure. All the memory cells in a selected block are erased by impressing a sufficiently high magnitude negative gate-to-source voltage across each memory cell transistor. One suitable set of read conditions includes driving essentially the entire memory array to a VEE voltage of, for example, 10 volts. In particular, for the selected block, the global bit line voltage $V_{GBL}$, both block select lines $V_{BSELB}$ and $V_{BSELD}$, and both shared bias nodes $V_{DRAIN}$ and $V_{DADJ}$ are all driven to an erase voltage. In the unselected blocks, the word lines $V_{WLUNSEL}$, the block select lines $V_{UNBSEL}$, and the shared drain nodes $V_{DUNSEL}$ are also all driven to the erase voltage. Then, after allowing time for the intermediate nodes in the selected block to charge to substantially the erase voltage conveyed on the global bit lines and shared drain nodes, the word lines in the selected block are brought to ground (as shown in FIG. 10), thus impressing an erase bias across each memory cell in the block. As the erasing of the memory cells may proceed somewhat slowly compared to programming, the erase conditions time may advantageously be held for an erase time of up to tens of milliseconds.

The erase voltage, shown as VEE, is preferably set to an initial erase voltage at the start of erase, but then is slowly decreased to a final erase voltage over the duration of the erase cycle. This provides more complete erasure of the memory cells than does holding the erase voltage at a single value (by reducing the charge leakage through the "blocking oxide" closest to the polysilicon gate). The support circuitry for the array may be arranged to couple the various signals described to an internally generated VEE signal, which is then controlled to achieve a controlled pulse shape as depicted in FIG. 10. The falling edge of the VEE pulse is preferably controlled to fall no faster than the rate of fall of the various intermediate nodes in the NAND strings of the selected block just erased, which is determined by the leakage currents through the cells. Alternatively, the word lines of the selected block could be returned to the VEE voltage, then the entire array brought back to ground by the falling edge of the VEE pulse.

While one block is presumed to be selected at a time for erasing in the above description, clearly more than one such block may be erased simultaneously, whether disposed on the same or on different levels of an array.

Suitable ranges for each of the voltages described above are summarized in the following Table 5.

TABLE 5

Erase Conditions

| Signal | Range |
|---|---|
| $V_{WL}$ | 0 V |
| $V_{WLPASS}$ | 0 V |
| $V_{BSELB}$ | 6 V ... 13 V |

TABLE 5-continued

Erase Conditions

| Signal | Range |
| --- | --- |
| $V_{BSELD}$ | 6 V ... 13 V |
| $V_{UNBSEL}$ | 6 V ... 13 V |
| $V_{GBL}$ | 6 V ... 13 V |
| $V_{DADJ}$ | 6 V ... 13 V |
| $V_{DRAIN}$ | 6 V ... 13 V |
| $V_{DUNSEL}$ | 6 V ... 13 V |

Figure 11:
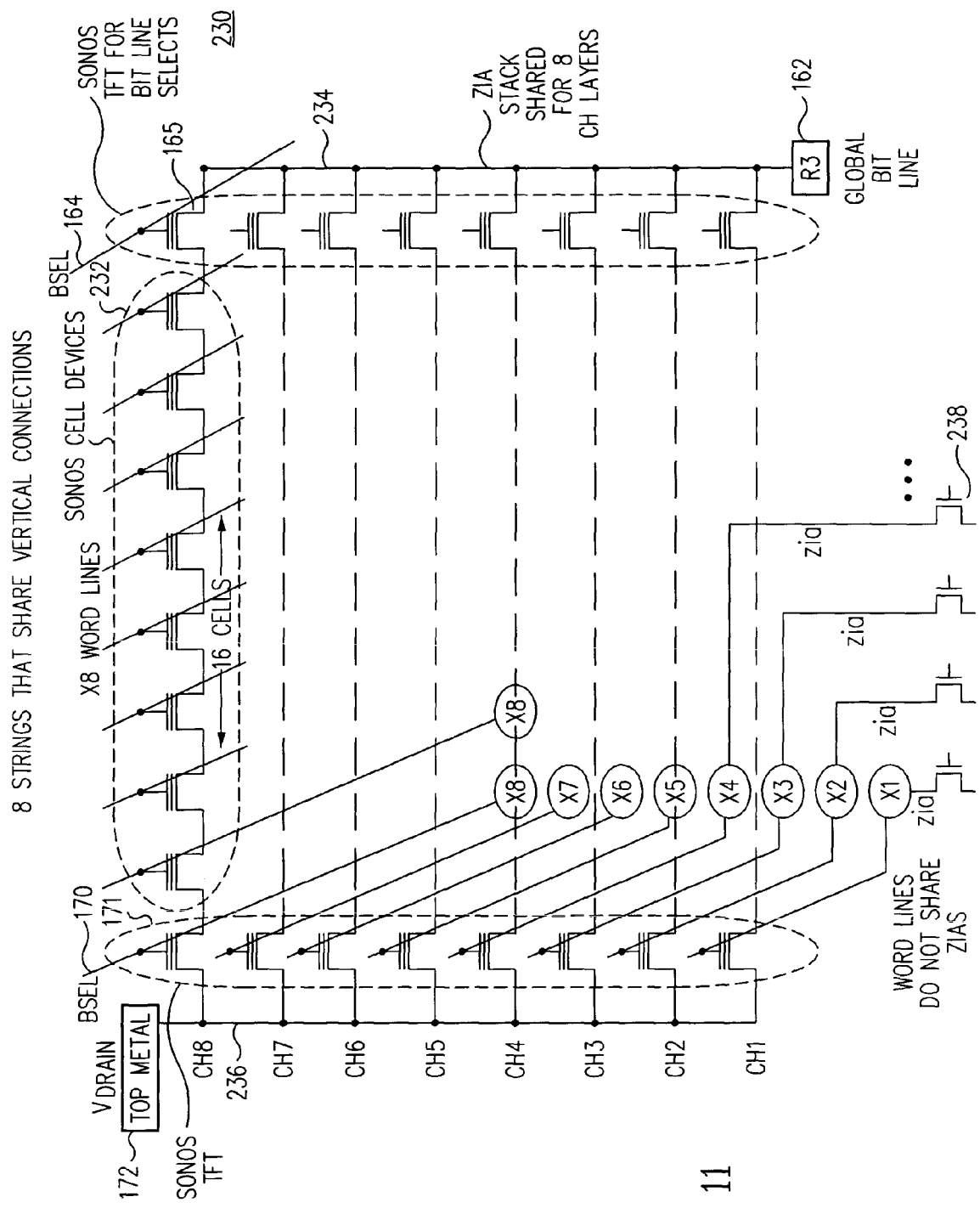
FIG. 11 is a schematic diagram depicting the interconnection of NAND strings on each of several memory levels, in accordance with an embodiment of the present invention.

Referring now to FIG. 11, a three-dimensional memory array embodiment is shown which utilizes the array configuration described above. A respective NAND string is shown on each of eight memory levels, each depicted lying substantially in vertical alignment with each other. Each NAND string includes, for example, 16 series-connected memory cell transistors and a respective block select transistor at each end. All eight NAND strings share the same global bit line 162, and which are all connected by way of a "zia" 234 (the name suggesting a stacked via structure connecting more than one level in the z-direction). As indicated in FIG. 3, eight NAND strings on the opposite side of the global bit line zia 234 are also shared by the global bit line 162, for a total (for this embodiment) of 16 NAND strings served by one zia to one global bit line. The zia 234 is preferably connected to a wiring line on a wiring layer below the memory array, labeled R3 in the figure.

Similarly, all eight NAND strings share the same VDRAIN node 172 (i.e., the same shared bias node) which are all connected by way of a zia 236, which is preferably connected to a interconnection line on a wiring layer above the memory array, labeled TOP METAL in the figure. As described earlier, the VDRAIN nodes may also be shared laterally within a memory level by, for example, four adjacent NAND strings, resulting in 32 block select devices connected to the right side of the zia 236, rather than just the eight block select devices represented in FIG. 11. With connections to 32 block select devices per zia 236, such a VDRAIN zia may also be termed a "mast."

In contrast to the shared vertical connections for the global bit line and VDRAIN node, each of the two block select control signals, and each the plurality of word lines on each level is preferably unique to that level, and thus affords independent selection of each level. As described above, the various bias conditions for blocks within non-selected levels is the same as for non-selected blocks within the selected level. Each word line is routed vertically to a wiring layer below the array by a zia which is not electrically connected to other word lines on the same level, nor is it shared with word lines on other levels, although as is described below, one embodiment of such word line zias makes physical contact to small sacrificial features of word lines on intervening memory levels to improve the consistency of zia formation across all memory levels. Selecting a word line on just one memory level allows the smallest number of blocks to be biased for programming or reading, thus reducing the disturb time. If one was not limited by a desire to limit the disturb time, some area could be saved by sharing word line zias between word lines on more than one level (e.g., sharing between analogous word lines on two levels of the array). Likewise, the block select lines could then also be shared by more than one level of the array.

Fabrication Process

Figure 12A:
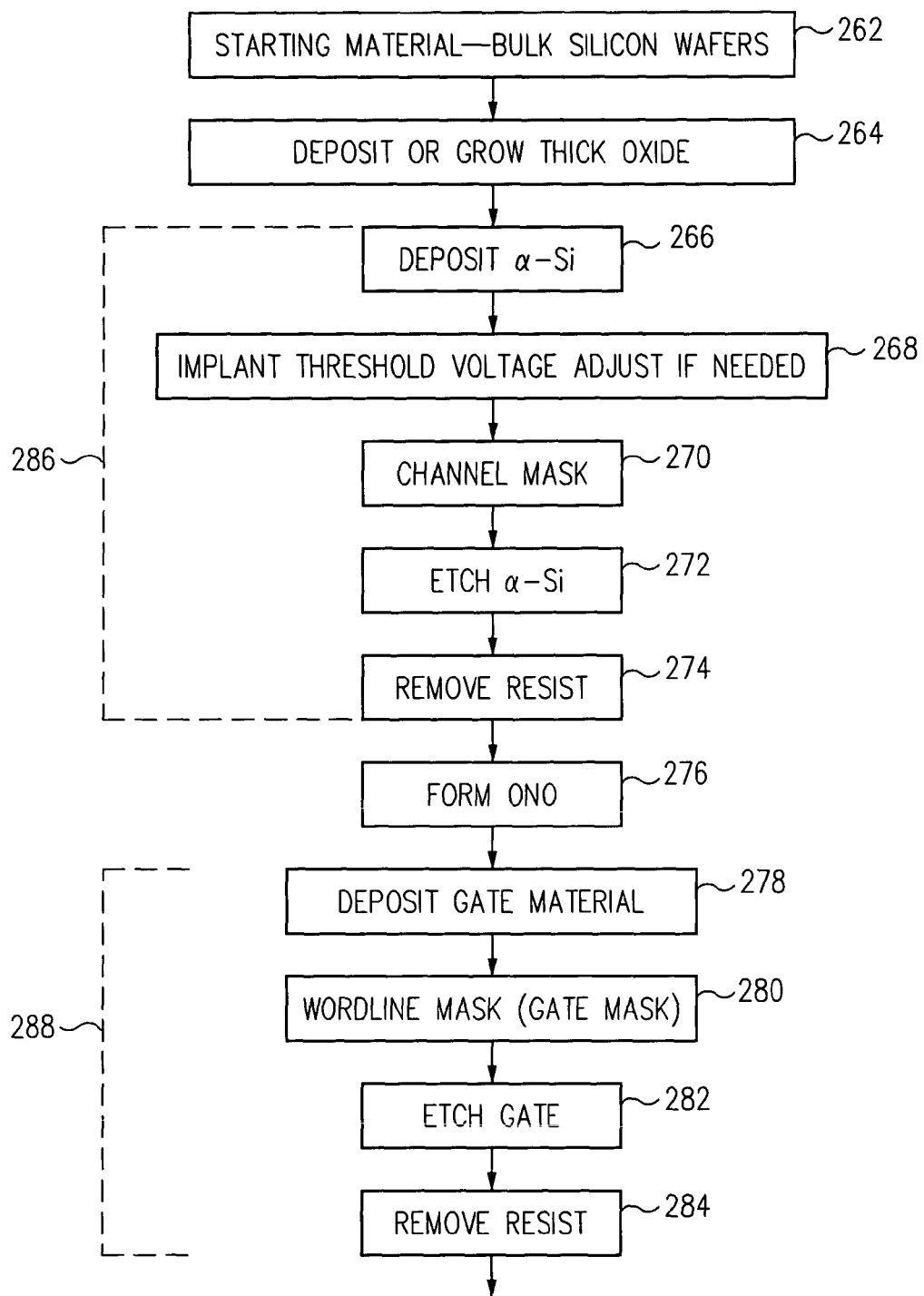
FIG. 12, shown as FIG. 12A and FIG. 12B, is a flow diagram of an exemplary semiconductor process flow for forming a memory array in accordance with various embodiments of the present invention.
Figure 12B:
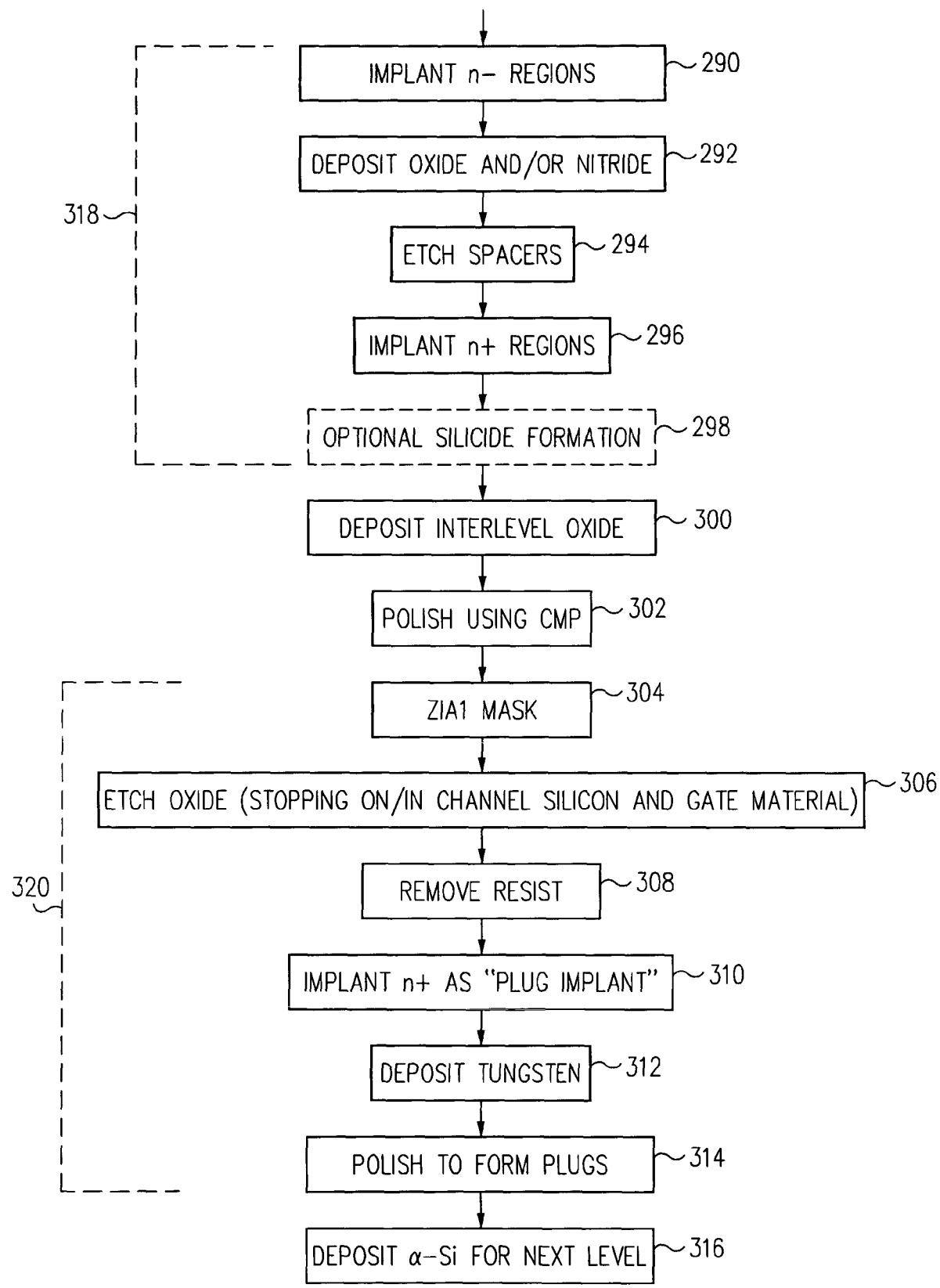

Referring now to FIG. 12, a flow diagram depicts an exemplary process for forming a memory level as described above. Such a flow may be used repeatedly to form multiple memory levels for a three-dimensional memory array, or may be used once to form a single memory level. Many other variations are contemplated, but the described flow is illustrative to point out various features and advantages of the invention.

The memory level is formed upon a starting material, as noted in step 262, which may include a semiconductor wafer already processed to include circuitry and wiring interconnections formed on a plurality of lower-level wiring layers formed above the substrate, or may include such a substrate already processed with memory array levels as described herein. At step 264 a relatively thick oxide is formed by growth, deposition, or other suitable method, to provide a dielectric isolation layer between the memory level and underlying structures. Such a dielectric layer may have a thickness in the range of 50 nm to several microns.

The collective steps 286 are invoked to form a plurality of channel stripes on the top surface of the dielectric layer. The individual steps involved include depositing an amorphous silicon layer, frequently known as an α-Si layer, at step 266. Alternatively, a polycrystalline silicon layer may be deposited. Such a silicon layer is preferably lightly-doped p-type polysilicon suitable for constructing N-channel SONOS devices, and is formed preferably to a thickness in the range from 5 nm to 200 nm. The silicon layer is preferably doped in-situ during the deposition process to result in activated dopants as deposited. Moreover, by doping in-situ, no separate implantation step is required to set the background concentration of the channel regions, thus potentially reducing manufacturing cost. Alternatively, the silicon layer may be deposited undoped and implanted. The silicon layer is preferably deposited in an amorphous state, and is poly-crystallized during the subsequent heat treatment steps without requiring a specific step just to perform the crystallization. Preferred methods for depositing the α-Si layer are described in co-pending U.S. application Ser. No. 10/334,649, filed on even date herewith, by Andrew J. Walker, et al., entitled "Formation of Thin Channels for TFT Devices to Ensure Low Variability of Threshold Voltages," which application is hereby incorporated by reference.

At step 268, the α-Si layer is optionally implanted to adjust the eventual threshold voltage of the memory cell devices in the NAND strings, as well as the block select devices. In some preferred embodiments, these devices are implanted to a depletion mode threshold voltage of approximately −2 to −3 volts. A depletion mode implant that is a slow diffuser, preferably antimony or arsenic, is implanted to shift the UV-erased, (i.e., minimum trapped charge in the nitride) $V_T$ of the cell device to depletion mode.

Figure 17:
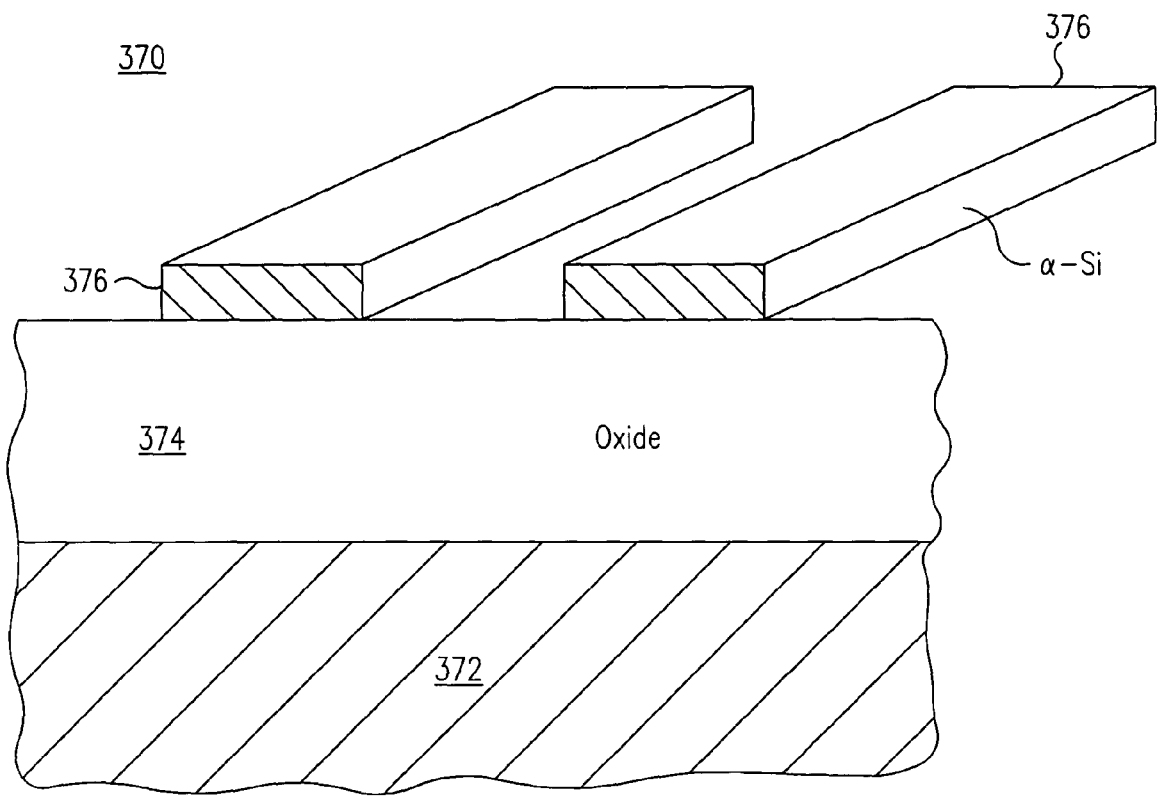
FIG. 17 is a perspective view of a partially-completed memory array level, in accordance with various embodiments of the present invention.

At step 270, a photoresist layer is deposited and exposed with a channel mask to define photoresist features corresponding to the desired channel stripes. The α-Si layer is then etched at step 272, preferably using an anisotropic etch, to form the channel stripes, and the remaining photoresist removed at step 274. The resulting structure is depicted in FIG. 17, which shows an underlying substrate 372, a dielectric layer (oxide) 374, and two α-Si channel stripes 376 formed on the top surface of the oxide 374.

Figure 13:
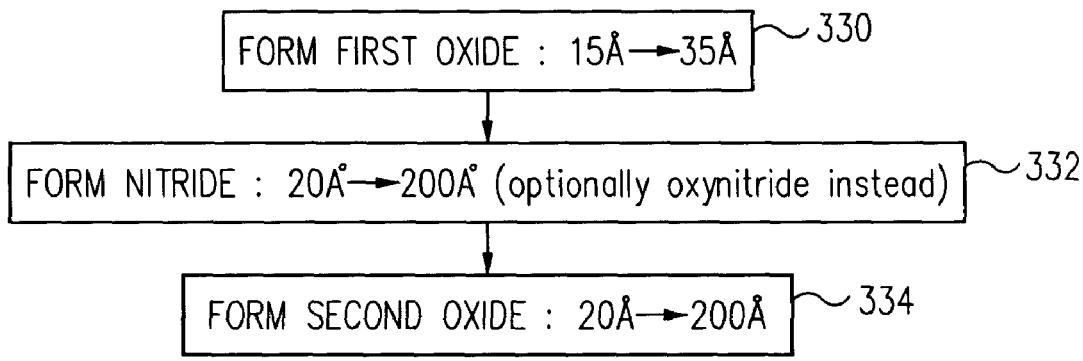
FIG. 13 is a flow diagram of a portion of an exemplary semiconductor process flow for forming a charge storage dielectric for a memory array in accordance with various embodiments of the present invention.

Next, at step 276, a charge storage dielectric layer, such as ONO dielectric stack, is formed on the channel stripes 376. Preferably, the ONO stack is formed on the sides of the channel stripes 376 as well as on the top surface, and also is formed on the top surface of the oxide 374 where exposed between channel stripes 376. Referring briefly to FIG. 13, an ONO stack may be formed by forming (at step 330) a first oxide layer having a thickness preferably in the range from 1.5 to 3.5 nm. Any of several techniques may be used, such as a Rapid Thermal Oxidation (RTO) in a pure oxygen environment, or in an oxygen environment diluted with nitrogen. Thermal oxidation in a furnace may also be employed to form this first oxide. As another alternative, an In-Situ Steam Generated Oxide (ISG) may be formed, as is described in co-pending U.S. application Ser. No. 10/079,472, filed on Feb. 19, 2002, by Maitreyee Mahajani, et al., entitled "Gate Dielectric Structures for Integrated Circuits and Methods for Making and Using Such Gate Dielectric Structures," which application is hereby incorporated by reference.

Continuing with the formation of the ONO stack, a nitride layer is next formed (at step 332) having a thickness preferably in the range from 2.0 to 20.0 nm. Any of several techniques may be used, such as a Low Pressure Chemical Vapor Deposition (LPCVD) process to deposit stoichiometric silicon nitride. An oxynitride layer may also be formed rather than a nitride layer.

Continuing with the formation of the ONO stack, a top or "blocking" oxide layer is next formed (at step 334) having a thickness preferably in the range from 2.0 to 20.0 nm. Any of several techniques may be used, and preferably an HTO process is employed.

Referring back to FIG. 12, after formation of the ONO layer at step 276, the word line stripes are next formed by collective steps 288. The individual steps include depositing a gate material layer, at step 278. Such a layer preferably includes heavily-doped p-type (i.e., P+) polysilicon at least at the bottom of the gate material layer, as is described in more detail herebelow.

Figure 18:
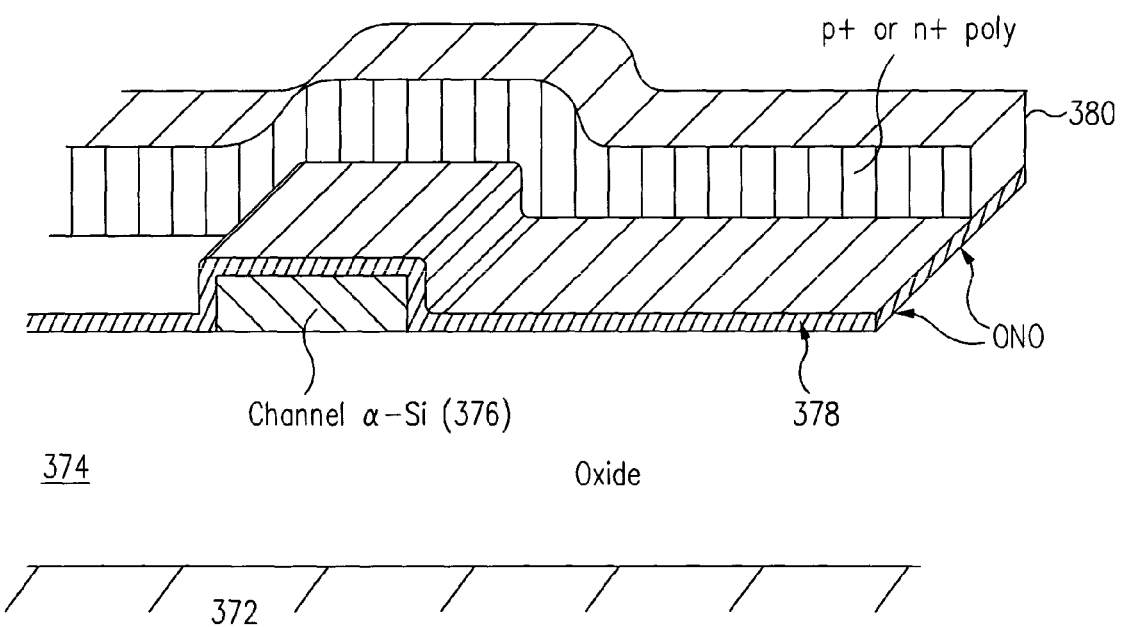
FIG. 18 is a perspective view of a partially-completed memory array level, in accordance with various embodiments of the present invention.

At step 280, a photoresist layer is deposited and exposed with a word line mask to define photoresist features corresponding to the desired word line stripes. The gate material layer is then etched at step 282, preferably using an anisotropic etch, to form the word line stripes, and the remaining photoresist removed at step 284. The resulting structure is depicted in FIG. 18, which shows an underlying substrate 372, a dielectric layer (oxide) 374, and a α-Si channel stripe 376 formed on the top surface of the oxide 374. A composite ONO layer 378 is shown on the top surface of the oxide 374 and the top and side of the channel stripe 376. A word line stripe 380 is also shown conformally following the top surface of the ONO layer as it rises over the underlying channel stripe 376.

Figure 14:
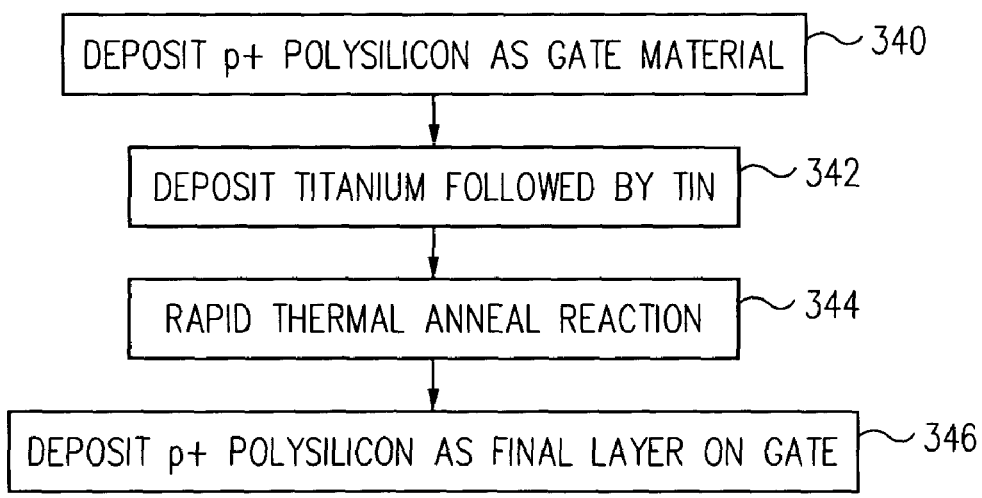
FIG. 14 is a flow diagram of a portion of an exemplary semiconductor process flow for forming a gate layer for a memory array in accordance with various embodiments of the present invention.
Figure 15:
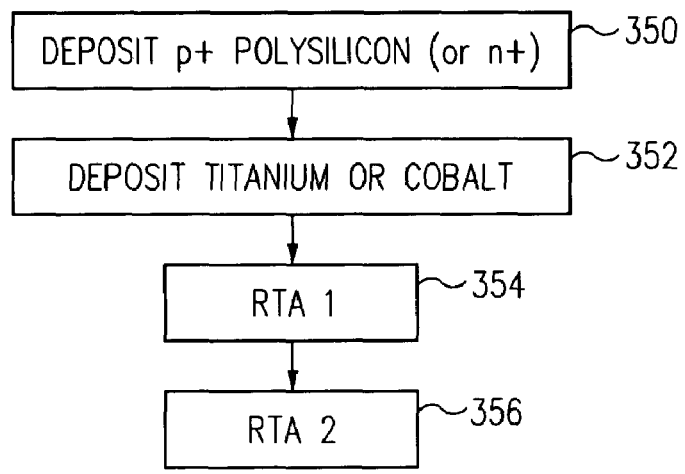
FIG. 15 is a flow diagram of a portion of an exemplary semiconductor process flow for forming a gate layer for a memory array in accordance with various embodiments of the present invention.

Referring briefly to FIG. 14, a suitable gate material layer may be formed as a polysilicon/silicide/polysilicon stack. First, a layer of heavily-doped polysilicon is formed, preferably by in-situ doping during a deposition process to result in activated dopants as deposited, without requiring any separate implantation operation. Alternatively, the polysilicon layer may be deposited undoped and implanted. A p-type gate layer is believed to result in improved erasure characteristics for the resultant SONOS devices (i.e., having less electron injection from the gate during erase), although N+ polysilicon may alternatively be employed. The gate doping concentration is preferably within the range of $10^{20}$-$10^{21}$ atoms/cm$^3$.

At step 342, a layer of titanium is deposited, followed by a titanium nitride layer, to form a low-resistance titanium silicide layer on top of the polysilicon layer during a subsequent RTA process (at step 344). Such an RTA is preferably carried out at a temperature in the range from 700-850° C. Lastly, a final polysilicon layer is deposited on the TiN layer to form the sandwich or stack of gate material layers. As before, P+ polysilicon is preferred, although N+ polysilicon may also be employed.

Figure 16:
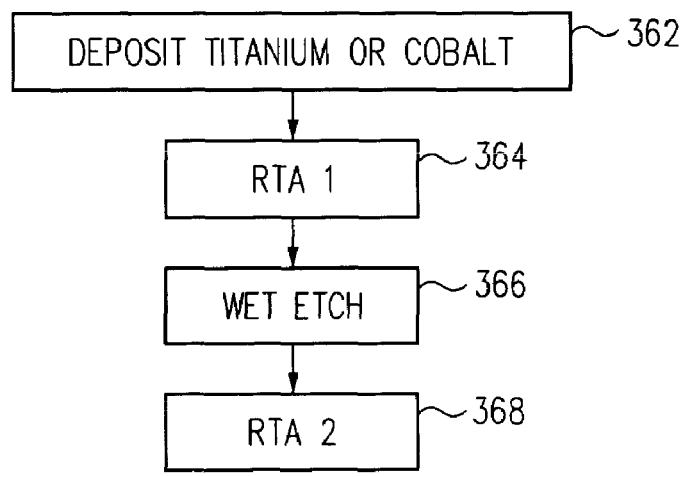
FIG. 16 is a flow diagram of a portion of an exemplary semiconductor process flow for forming a suicide layer for a memory array in accordance with various embodiments of the present invention.

Referring briefly to FIG. 16, the gate material layer may also be formed by, for example, depositing P+ (or N+) polysilicon (step 350), depositing a metal such as titanium or cobalt (step 352), then forming a silicide of the metal in a first RTA operation (step 354) and a second RTA operation (step 356), as is well known in the art.

Either of these gate material layers may then be masked and etched as described above to form a plurality of word line stripes over the ONO layer and channel stripes. As described below, the word line stripes may also be formed using a salicide procedure to create low resistance word lines rather than forming a silicide layer prior to gate etch.

Referring back to FIG. 12, after formation of the word line stripes, the flow continues by forming source/drain regions in the channel stripes in the exposed portions of the channel stripes between word line stripes. Such source/drain regions may be formed by collective steps 318, which may include the steps of implanting N− regions (step 290), forming spacers (steps 292 and 294), and implanting N+ source/drain regions (step 296). The N+ source/drain implant conditions (and to a much lesser extent, the lightly-doped source/drain implant conditions) should be chosen to achieve a desired doping and junction depth of the source/drain regions, but should leave at least the bottom portion of the polysilicon gate structure doped P+ (i.e., still P+ doped at the ONO interface). In some embodiments, a silicide layer may be formed on the word line stripes and also on the source/drain regions, at step 298. Referring briefly to FIG. 16, a self-aligned silicide (i.e., a salicide) may be formed by depositing a metal such as titanium or cobalt (step 362), then forming a silicide of the metal in a first RTA operation (step 364), removing the unreacted metal by a wet etch (step 366), followed by a second RTA operation (step 368), as is well known in the art.

Figure 19:
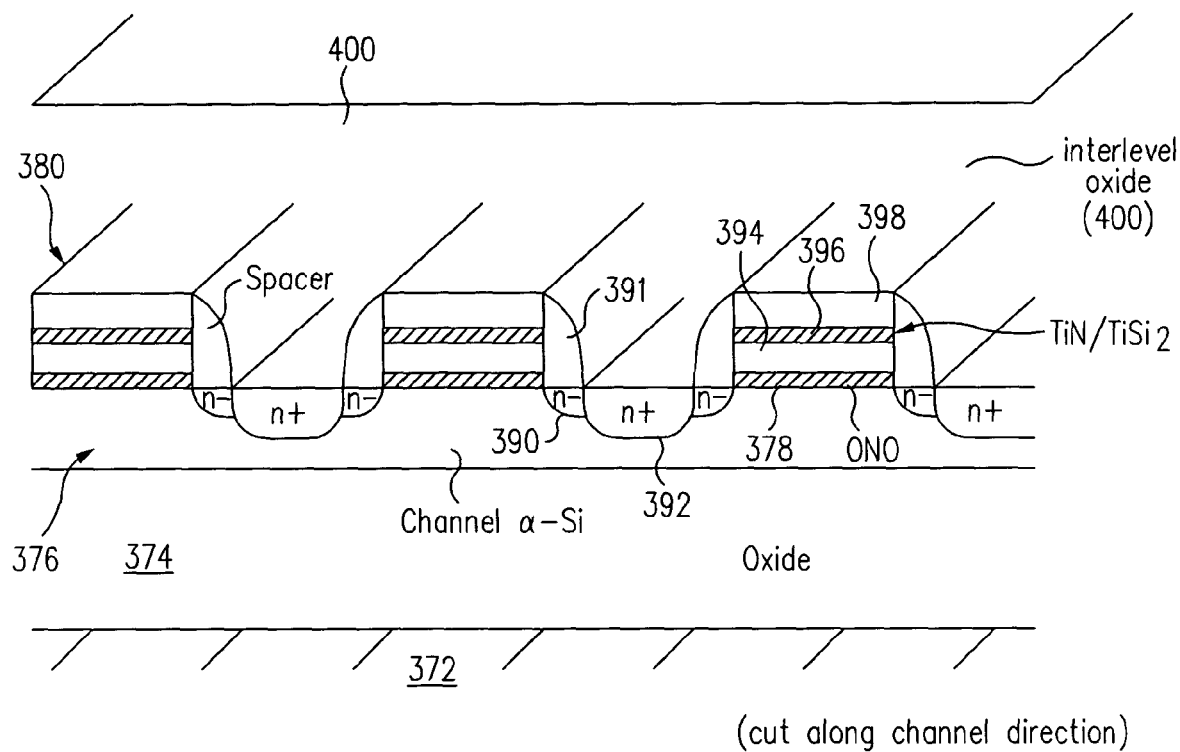
FIG. 19 is a cross-sectional view of a portion of a NAND string within a memory array level, in accordance with various embodiments of the present invention.

Again referring back to FIG. 12, after formation of the source/drain regions in the exposed portions of the channel stripes between word line stripes, the block select and memory cell transistor formation is substantially complete, but forming electrical connections still remain. An interlevel dielectric layer, such as an oxide layer, is deposited at step 300 and planarized by chemical-mechanical polishing (CMP) at step 302. The resulting structure, in one embodiment, is depicted in FIG. 19, which shows a cross-section view which is "cut" longitudinally along a channel stripe 376. Three word line stripes (e.g., 380) are shown, having sidewall spacers 391. Each transistor includes a shallow lightly-doped source/drain region 390 formed below each spacer 391, and a heavily-doped N+ source/drain region 392 is formed between each word line stripe. In this figure each word line stripe 380 is shown as a poly/silicide/poly stack, comprising a lower polysilicon layer 392, a silicide layer 396, and an upper polysilicon layer 398. An ONO layer 378 is shown between the word line stripe (i.e., the gate) and the transistor channel 376. The ONO layer is typically removed over the source/drain regions 392 when forming the sidewall spacers, although any remaining ONO over the source/drain regions is harmless. An interlevel dielectric layer 400 is also shown filling the area between the word line stripes and covering the word line stripes. In an alternative method, the lightly-doped source/drain regions 390 may be absent, and only the more heavily-doped N+ source/drain regions 392 are actually present (and intentionally out-diffused to fall nearer the polysilicon gate edge. In yet another alternative method, the sidewall spacers 391 and the lightly-doped source/drain regions 390 may be absent, and only the heavily-doped N+ source/drain regions 392 present. Moreover, the N+ regions 392 may be formed fully through and reach the bottom of the channel stripe 376.

Figure 20:
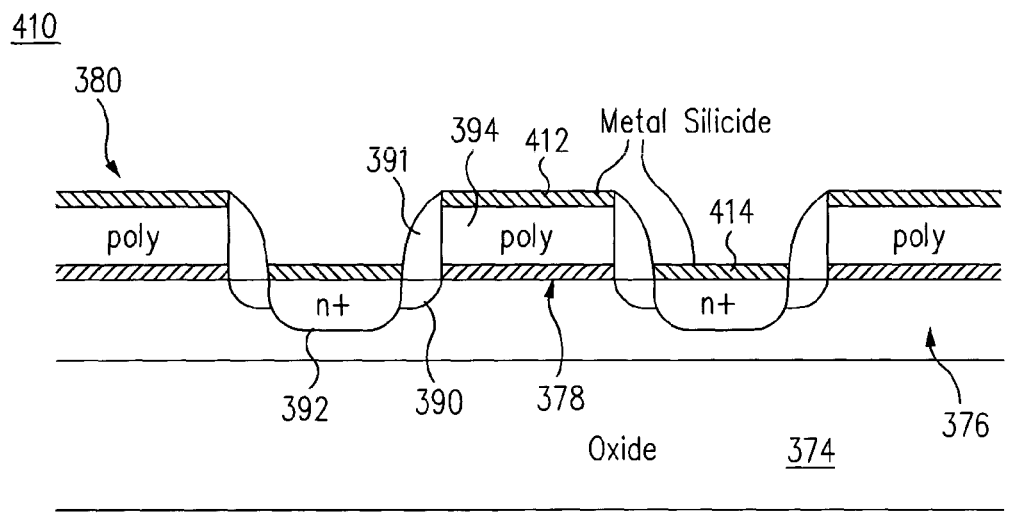
FIG. 20 is a cross-sectional view of a portion of a NAND string within a memory array level, in accordance with various embodiments of the present invention.

In another embodiment, the resulting structure is depicted in FIG. 20, which also shows a cross-sectional view which is "cut" longitudinally along a channel stripe 376. Three word line stripes (e.g., 380) are shown having sidewall spacers 391. Each transistor includes a shallow lightly-doped source/drain region 390 formed below each spacer 391, and a heavily-doped N+ source/drain region 392 formed in the channel stripe in "exposed" areas between each word line stripe. In this figure each word line stripe 380 is shown as a silicided polysilicon line, comprising a polysilicon layer 394 and a silicide layer 412. An ONO layer 378 is shown beneath the gate stripe. The ONO layer has been removed over the source/drain regions 392 by formation of the sidewall spacers, and a silicide layer 414 formed on the surface of each source/drain region 392.

Figure 21:
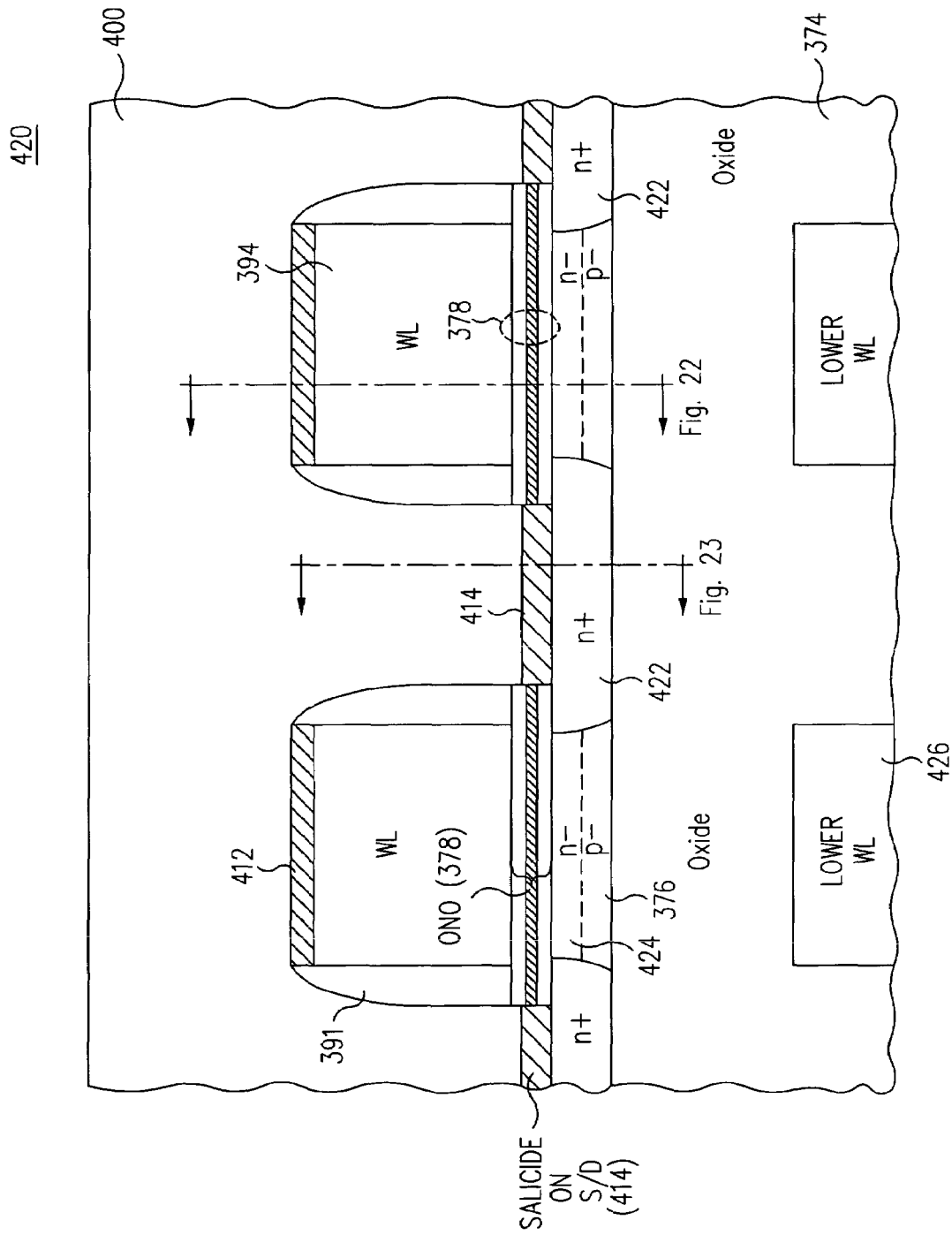
FIG. 21 is a cross-sectional view of a portion of a NAND string within a memory array level, and showing an upper-portion of an underlying memory array level, in accordance with various embodiments of the present invention.

Referring now to FIG. 21, another embodiment is depicted showing a heavily-doped source/drain region 422 formed all the way through the channel stripe 376. A threshold implant layer 424 is shown directly below the ONO layer 378 underneath the gate (i.e., the word line stripe). Such an implant layer 424 may result from a depletion mode implant performed into the channel stripes to set the full-erased threshold voltage to a typical value of from −2 to −3 volts. An interlevel dielectric layer 400 is shown, as before, as well as another interlevel dielectric layer 374 separating the memory level depicted from word line stripes 426 for the next lower memory level. Two cross-sectional views presented in subsequent figures are referenced in the figure, one cutting across the channel stripes in the transistor channel region of a memory cell (FIG. 22), and the other cutting across the channel stripes in the source/drain region 422 (FIG. 23).

Figure 22:
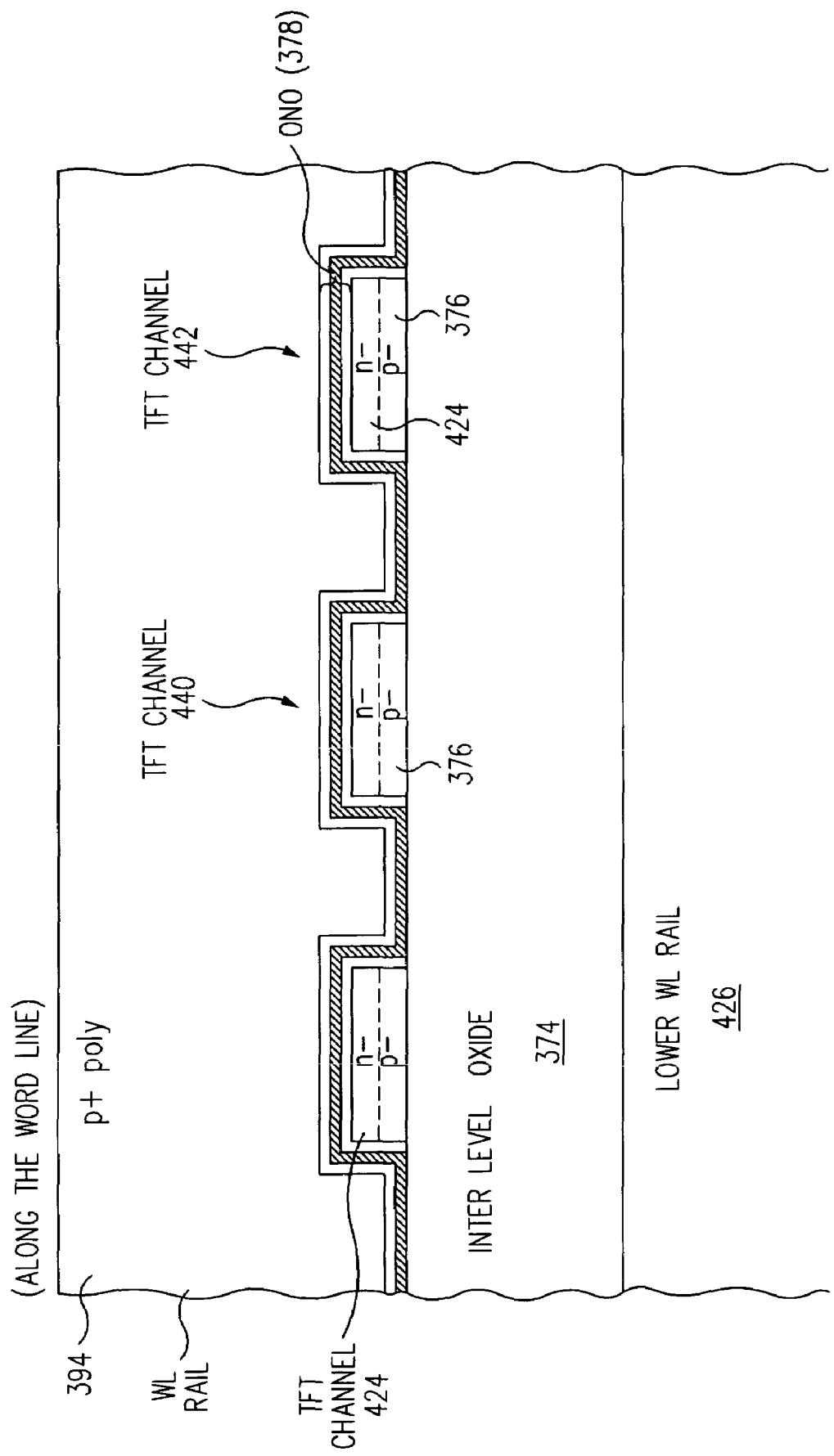
FIG. 22 is a cross-sectional view along a gate stripe and cutting across several NAND strings within a memory array level, and showing an upper-portion of an underlying memory array level, in accordance with various embodiments of the present invention.
Figure 23:
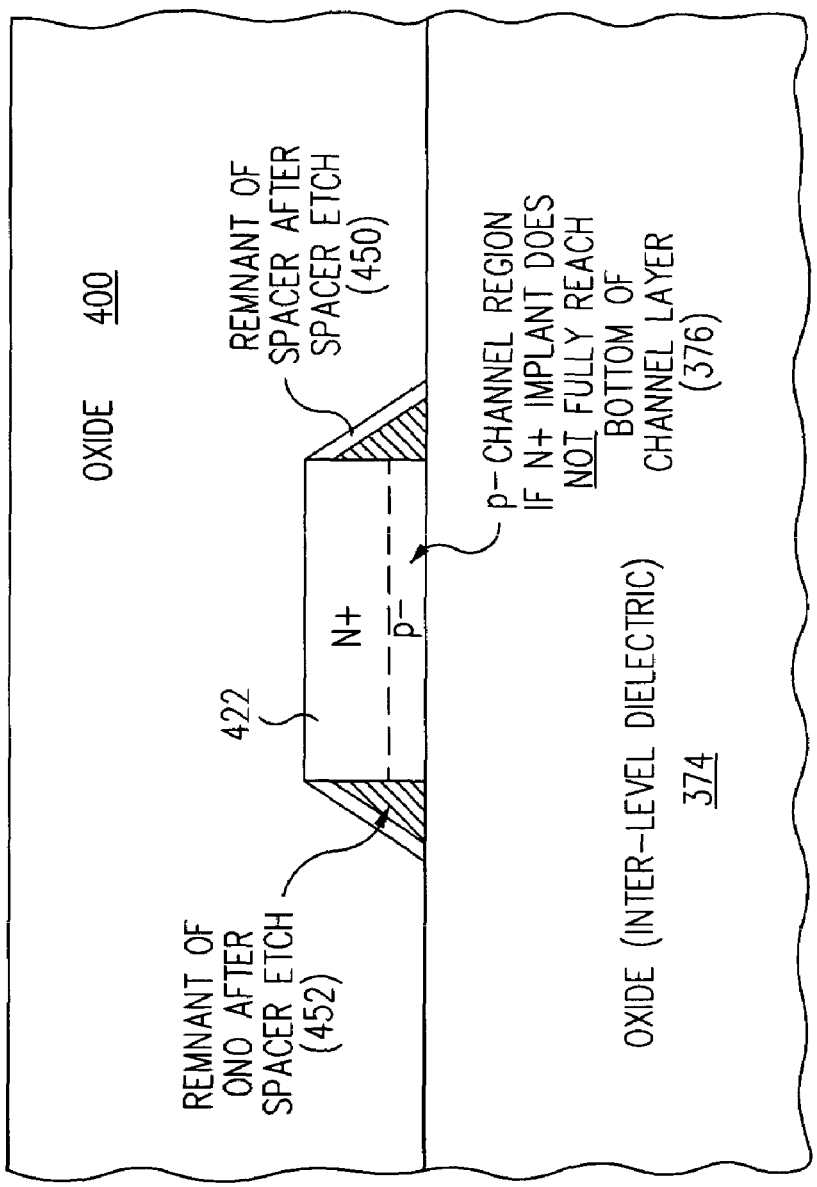
FIG. 23 is a cross-sectional view between gate stripes and cutting across a NAND string within a memory array level, in accordance with various embodiments of the present invention.

FIG. 22 shows a cross-sectional view of the structure depicted in FIG. 20, which is "cut" longitudinally along a word line stripe 394. Three channel stripes (e.g., 440, 442) are shown, each having a threshold implant layer 424 formed in the upper portion of the channel stripe 376, and a remaining P− doped region in the lower portion of the channel stripe. The ONO layer 378 is shown conformally disposed on the vertical edges of the channel stripes, and on the top surfaces of the channel stripes and the interlevel dielectric layer 374. The word line stripe 394 is also preferably formed conformally on the ONO layer 378. By having the ONO layer and the word line stripe also disposed on the sides of each channel stripe, the effective electrical width of the transistor is wider than the horizontal dimension of the channel stripe, allowing the device to conduct more current for a given voltage drop across the device. In other contemplated embodiments, however, a dielectric material may fill the spaces between the channel stripes, and the gate stripes thus forming a transistor only on the top surface of the channel stripes. For example, a dielectric may be deposited to fill the spaces between channel stripes, and then planarized, such as by chemical-mechanical polishing (CMP). An ONO layer may then be formed on the planarized surface, and then the gate stripes formed on the surface of the ONO layer.

Again referring back to FIG. 12, after formation of the interlevel dielectric layer, electrical connections are formed to the underlying channel stripes and word line stripes. The collective steps 320 may then be employed to form plugged vias (herein sometimes referred to as "zias") in the interlevel dielectric layer to make connections to the channel stripes and word line stripes of the memory level. At step 304, a photoresist layer is deposited and exposed with a zia mask to define photoresist features corresponding to the desired zia openings. The interlevel dielectric 400 is then etched at step 306, preferably using an anisotropic etch. The zia etch preferably downward, preferably stopping on channel stripes (i.e., silicon) and word line stripes (i.e., silicon or silicide), and the remaining photoresist removed at step 308. A "plug implant" is performed into the openings to ensure low resistance contact to the underlying structures (step 310), frequently followed by a deposition of an adhesion layer material, such as TiN. Then a plug metal, such as tungsten, is deposited to fill the openings (step 312). The resulting structure is polished (step 314) to form zia plugs having a top surface coplanar with the top surface of the interlevel dielectric layer 400. Resulting structures are described herebelow in regard to later figures. At step 316, the α-Si layer for the next memory level may be formed, as described above.

Exemplary process specifications which are particularly suitable for fabricating the above structures are shown in Table 6 below.

TABLE 6

| Parameter | Thickness/Dimensions |
| --- | --- |
| Channel silicon | 50-2000 Å |
| ONO | 150 Å |
| Dielectric spacer | 200-500 Å |
| Gate poly | 1000-2000 Å |
| Polycide sheet R | 5-10 Ohm/Sq (500-250 Å CoSi2) |
| Channel "cide" sheet R | Not critical |
| Poly gate line/space | 0.15μ/0.15μ (for a 0.15μ technology) |
| Channel line/space | 0.15μ/0.15μ (for a 0.15μ technology) |

The zias may be formed through an interlevel dielectric layer associated with just one memory level to make contact to channel stripes and word line stripes within that memory level. Such a flow requires a separate zia mask for each memory level. In another embodiment, the zias may be formed to make contact simultaneously to structures on more than one memory level, thus requiring fewer zia masking operations.

Figure 24:
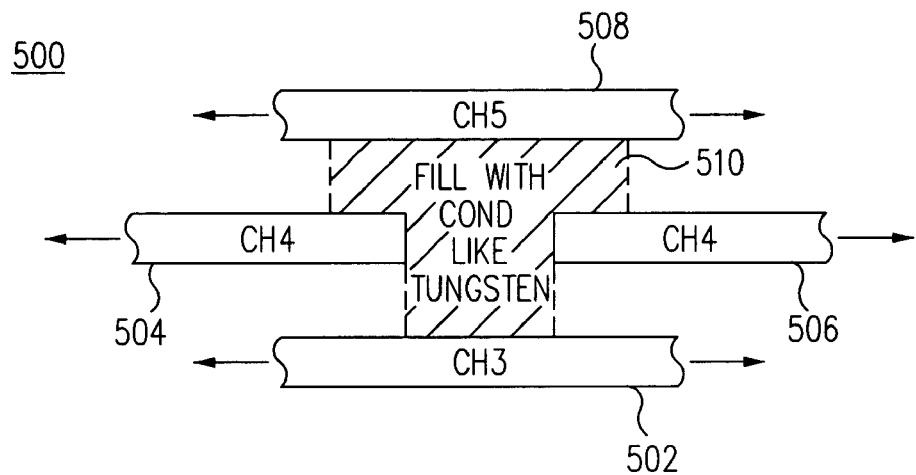
FIG. 24 is a cross-sectional view of a via structure (i.e., a "zia") making contact to three layers of the memory array, in accordance with various embodiments of the present invention.

Referring now to FIG. 24, a cross-sectional view of a multi-level zia structure 500 is shown. A single zia 510 is formed making a connection to a channel string 502 on level 3 (CH3), making a connection to a channel string 504 and a channel string 506 on level 4 (CH4), and making a connection to a channel string 508 on level 5 (CH5). The opening through the interlevel dielectric layer between CH4 and CH5, and the narrower opening through the interlevel dielectric layer between CH4 and CH3, may be formed using a single etch operation. Similarly, other operations, such as plug implants, adhesion layer deposition, and filling the zia with a metal, such as tungsten, may also be done once, and yet make connection between three levels rather than just two.

Figure 25:
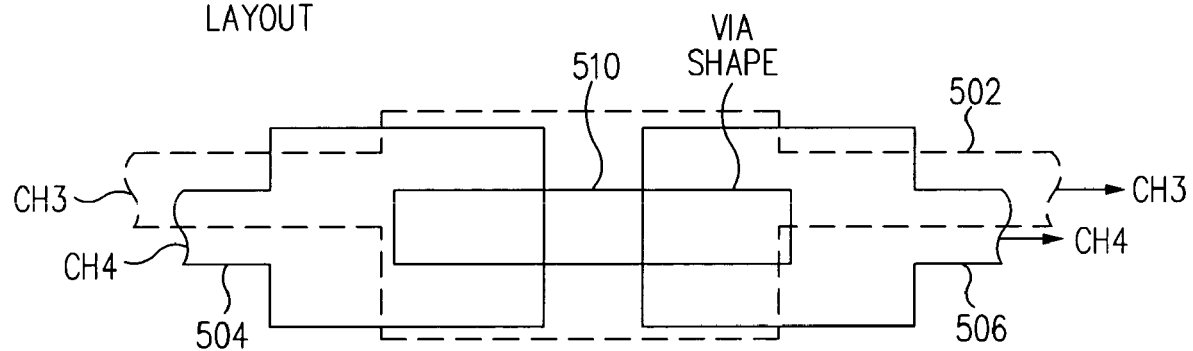
FIG. 25 is a layout diagram of a zia and three memory array layers which corresponds to the zia structure shown in FIG. 24.

Referring now to FIG. 25, a layout is shown which may be used for this zia 510. While the zia 510 appears to overlap the CH3 feature 502 (thus violating a traditional via enclosure rule), only the portion of the zia feature 510 which lies between the two CH4 features 504 and 506 actually etches down to and reaches the CH3 feature 502. This zia structure is somewhat larger than a pure stacked via structure, but reduces the number of masks and processing steps significantly over a pure stacked via process which forms a separate plugged via at each memory level.

Figure 26:
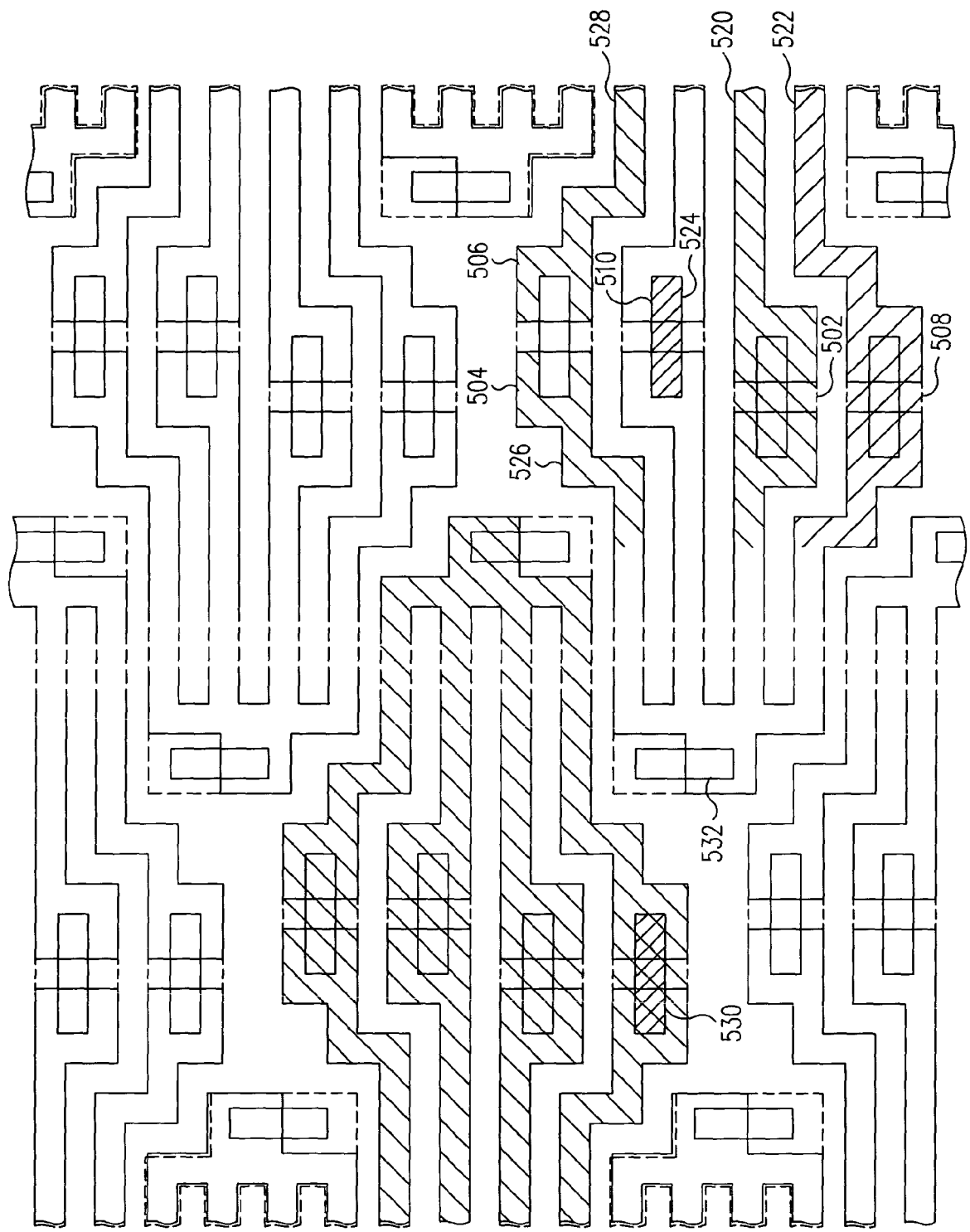
FIG. 26 is a layout diagram of a multi-level 4:1 interleaved NAND string memory array structure which corresponds to the schematic diagram shown in FIG. 3, and includes zias as depicted in FIG. 24.

Referring briefly back to FIG. 3, a schematic was depicted representing an interleaved arrangement of NAND strings. A group of four NAND strings share a VDRAIN connection at one end of each NAND string, and make individual connection to a respective global bit line at the other end-of each NAND string. Each contact to a global bit line is also shared by two NAND strings. Referring now to FIG. 26, an exemplary layout is depicted which corresponds to this schematic. The layouts of various channel stripe features are shown, along with various zias, although none of the block select lines and word lines are shown (if shown, they would run vertically in the dashed section in the middle portion of the figure). The layout may be viewed as representing the channel strings on all eight levels of a three-dimensional array. But for description purposes, the layout is labeled to point out three channel levels for consistency with FIG. 24. For example, the cross-hatched portion of the channel string feature labeled 520 corresponds to the CH3 feature 502 shown in FIG. 24. The cross-hatched portions of the channel string features labeled 526 and 528 correspond to the CH4 features 504 and 506, while the cross-hatched portion of the channel string feature labeled 522 corresponds to the CH5 feature 508. The layout feature 524 corresponds to the zia 510, as does feature 530. A shared VDRAIN "mast" 532 makes connection to the CH3, CH4, and CH5 levels as well. As can be appreciated, the structure depicted provides for very compact shared vertical connections to NAND strings on multiple levels, which is important in preserving array efficiency if the NAND strings are fairly short.

Figure 27:
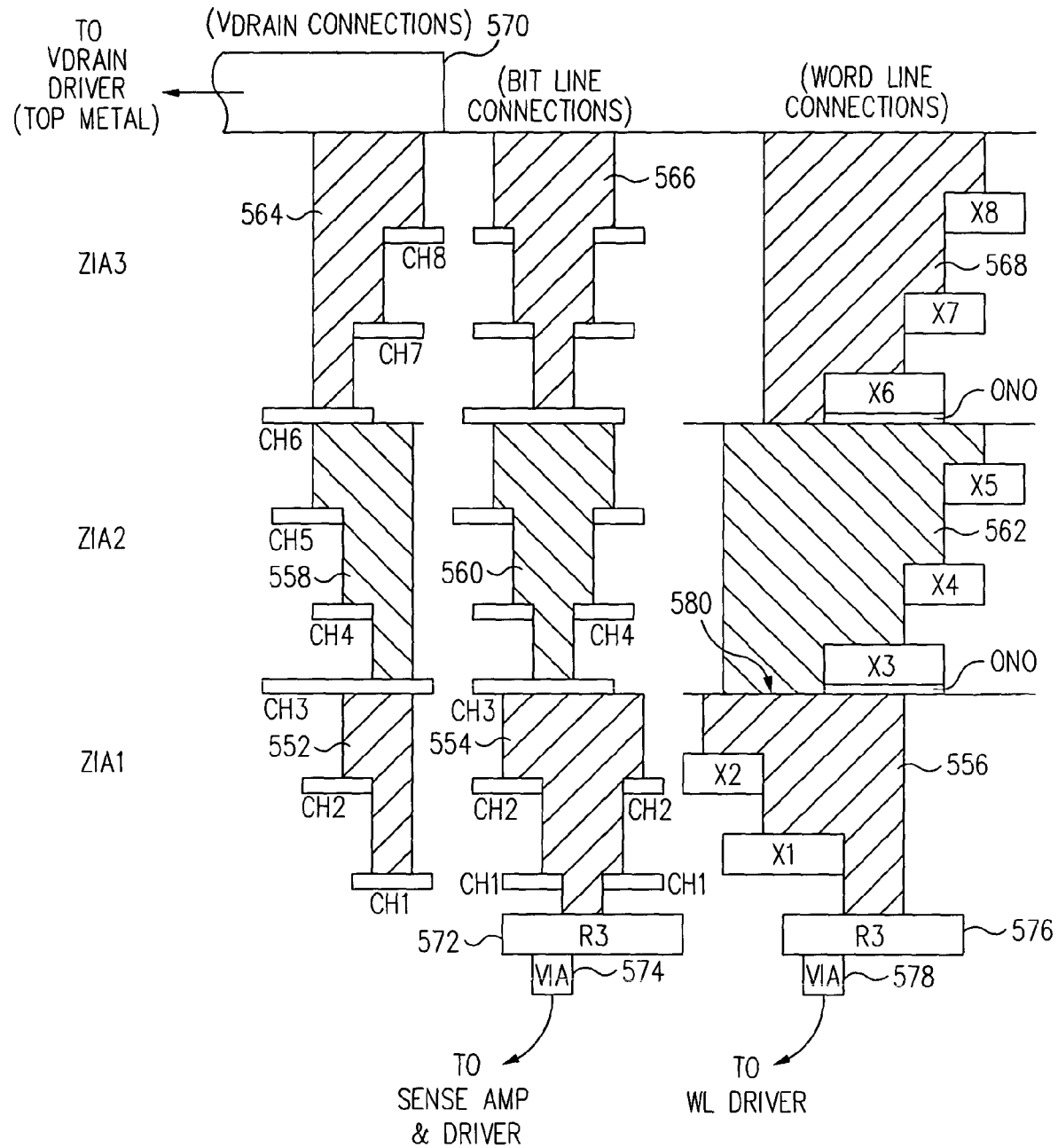
FIG. 27 is a cross-sectional view depicting the vertical interconnection of between the channel strings and gate strings within eight memory levels by use of only three zia levels, in accordance with various embodiments of the present invention.

Referring now to FIG. 27, a cross-sectional view is depicted of an eight-level memory array, showing the multi-level zias ZIA1, ZIA2, and ZIA3 making vertical connections through all eight levels. For example, the zia 552 (of the first ZIA1 level) makes connection to the shared VDRAIN nodes on the CH1, CH2, and CH3 levels. The zia 554 makes connection to the CH1, CH2, and CH3 levels to form the shared global bit line contact, and further makes contact to an interconnect line 572 disposed on a lower-level routing layer R3, which is routed to sense and driver circuitry for the global bit line (such as through via 574 to an even lower level interconnect layer). The zia 556 makes connection to the X1 X2 levels (the gate levels forming the word lines and block select lines) to form a connection from a word line level to an interconnect line 576 disposed the routing layer R3, which is routed to driver circuitry for the word line by way of via 578 to an even lower level interconnect layer.

The zias 552, 558, and 564 collectively form a shared VDRAIN "mast" 236 for all eight memory levels as depicted in FIG. 11, and provide connection to a top metal interconnect line 570 which preferably is routed parallel to the word lines. The zias 554, 560, and 566 collectively form a vertical global bit line contact 234 for all eight memory levels, also as depicted in FIG. 11. The zias 556, 562, and 568 provide a vertical connection from an X-level (e.g., X4) to an R3 interconnect layer. As described above, the word lines and block select lines for the various levels are not vertically connected like the shared drain and shared global bit line connections, but rather each word line and block select line is taken to an R3 interconnect line individually (in a logical sense). However, in a physical sense, small layout features on each X-level are preferably used to achieve the zia structure shown in FIG. 27 to better provide a more uniform process flow.

The surface 580 represents the top surface of zia 556, which is directly contacted by the next zia 562. Alternatively, a CH3 feature may be placed in this region so that the etch operation forming the hole for the zia 562 may stop on a silicon feature rather than exposing a tungsten feature (i.e., zia 556). Such a series connection through the CH3 feature is not believed to significantly affect the resistance of the zia stack. Likewise, a CH6 feature may be included at the bottom of each ZIA3 feature making connections to the X-layers. By so doing, all ZIA2 and ZIA3 zias may be processed to stop on the same CH6 level.

Referring now to FIG. 28, the multi-level zia concept may be easily extended to additional numbers of simultaneously connected levels. A single zia 599 is formed making a connection to a channel string 592 on the CH3 level, making a connection to a channel string 594 and a channel string 595 on the CH4 level, making a connection to a channel string 596 and a channel string 597 on the CH5 level, and making a connection to a channel string 598 on the CH6 level. The opening through the interlevel dielectric layer between CH6 and CH5, the narrower opening through the interlevel dielectric layer between CH5 and CH4, and the even narrower opening through the interlevel dielectric layer between CH4 and CH3, may all be formed using a single etch operation.

Referring now to FIG. 29, a cross-sectional view of another multi-level zia structure is depicted. A single 'chimney-like' zia 619 is formed making a connection to a channel string 612 on the CH3 level, making a connection to a channel string 614 and a channel string 615 on the CH4 level, making a connection to a channel string 616 and a channel string 617 on the CH5 level, and making a connection to a channel string 618 on the CH6 level. In this example, the side walls of the opening formed through the various interlevel dielectric layers are substantially vertical, and electrical connection is provided by the plugged zia mostly to the vertical "ends" of the CH4 and CH5 features. Such a chimney-like zia reduces layout area because the opening through each level is more uniform, and may reduce the number of masking steps required. Such a zia may also be useful to ensure that the zia etch does not completely etch through the intermediate channel stripes which are preferably relatively thin. Although the contact resistance may be higher than other via or zia structures, such a chimney-like zia may be advantageously used for connecting the NAND strings to the global bit lines because the current through the NAND strings is frequently quite low.

An exemplary layout making use of such a zia 610 is depicted in FIG. 30. In this example, two adjacent NAND strings share a VDRAIN connection 636. A shared global bit line zia 634 makes a vertical connection between several coincidently-drawn channel strings 632. Several such zias 634 may be employed to provide connection to a channel strings on a large number of memory levels.

Additional Embodiments

As used herein, a series-connected NAND string includes a plurality of devices connected in series and sharing source/drain diffusions between adjacent devices. As used herein, a memory array may be a two dimensional (planar) memory array having a memory level formed in a substrate, or alternatively formed above the substrate. The substrate may either be a monocrystalline substrate, such as might include support circuitry for the memory array, or may be another type of substrate, which need not necessarily include support circuitry for the memory array. For example, certain embodiments of the invention may be implemented utilizing a silicon-on-insulator (SOI) structure, and others utilizing a silicon-on-sapphire (SOS) structure. Alternatively, a memory array may be a three-dimensional array having more than one plane of memory cells (i.e., more than one memory level). The memory levels may be formed above a substrate including support circuitry for the memory array.

The present invention is contemplated for advantageous use with any of a wide variety of memory array configurations, including both traditional single-level memory arrays and multi-level (i.e., three-dimensional) memory arrays, and particularly those having extremely dense X-line or Y-line pitch requirements. Moreover, the invention is believed to be applicable to memory array having series-connected NAND strings which utilize modifiable conductance switch devices as memory cells, and is not to be limited to memory cells incorporating a charge storage dielectric. Such modifiable conductance switch devices are three-terminal devices whose conductance between two of the terminals is modifiable, and further is "switched" or controlled by a signal on the third or control terminal, which is generally connected to the word lines (or to the block select lines, for some embodiments). The conductance may be modified during manufacture (e.g., by selective ion implantation using a masking layer), or may be modified post-manufacture (i.e., by programming using a tunneling current; by programming using a hot electron current, etc). The modifiable conductance frequently is manifested as a modifiable threshold voltage, but may be manifested as a modifiable transconductance for some technologies.

As an example, a read-only memory (ROM) may be implemented using memory cell transistors arranged in a NAND string, where the respective threshold voltage of the memory cell transistors is determined during manufacture by any of the known techniques in the art (e.g., by selective ion implantation).

Another exemplary memory array may implement NAND strings of "polarizable dielectric devices" such as Ferroelectric devices, where the device characteristics are modified by applying a voltage on the gate electrode which changes the polarization state of the Ferroelectric gate material.

Yet another exemplary memory array may implement NAND strings of so-called "single electron" devices or "coulomb blockade" devices, where applied voltages on the word line change the state of electron traps formed by silicon nanoparticles or any quantum well structure in the channel region by which the conduction characteristics of the NAND string devices are changed. In some embodiments, the structure of the charge storage region of the NAND string devices could also be located in a nanometer sized (i.e., from 0.1 to 10 nanometers) silicon filament formed at the source or drain edges of the gate structure to modify the device characteristic. Other alternative embodiments may utilize an organic conducting layer for the channel region and form organic material devices in a NAND string whose conductive state is selectively changed by applying an appropriate voltage to the word lines.

Thus, while the embodiments described in detail above utilize charge storage dielectric such as an ONO stack, other memory cells such as ROM programmed threshold devices, polarizable dielectric devices, single electron or coulomb blockade devices, silicon filament charge storage devices, and organic material devices are also contemplated.

Moreover, while the embodiments described in detail above provide two conductance values corresponding to two different data states, and thus provide for storing one bit of information per memory cell, the invention may also be utilized to provide more than one bit per memory cell. For example, a charge storage dielectric may store charge in a number of localities. For some structures and programming techniques, the charge may be stored substantially uniformly along the device channel length when the programming mechanism acts uniformly along the channel (e.g., such as by tunneling), or the charge may be stored just at the source or drain edges when a programming mechanism such as hot carrier injection is used. Multiple bits of information could be stored in each NAND string device by locally storing charge at the source or drain edge in the case of hot electron programming, single electron memory devices or silicon filaments located at the source or drain edges. Multiple bits of information could also be stored by injecting several different levels of charge into the charge storage medium and associating different charge levels with different stored states.

In many of the embodiments described above, the block select devices are formed using the same process flow as the memory cells to reduce the number of process steps and device structures fabricated at each memory level. Thus the block select devices are formed having the same structure as the memory cells, although they may be sized differently. As used herein, such block select devices may be considered to be structurally substantially identical to the memory cell devices, even though the respective threshold voltages may be programmed or erased to different values.

It should be appreciated that the various bias voltages described herein, including negative voltages and high-voltage programming and erase voltages, may be received from external sources, or may be generated internally using any of a number of suitable techniques. It should also be appreciated that the designations top, left, bottom, and right are merely convenient descriptive terms for the four sides of a memory array. The word lines for a block may be implemented as two inter-digitated groups of word lines oriented horizontally, and the global bit lines for a block may be implemented as two inter-digitated groups of global bit line oriented vertically. Each respective group of word lines or global bit lines may be served by a respective decoder/driver circuit and a respective sense circuit on one of the four sides of the array. Suitable row and column circuits are set forth in "Multi-Headed Decoder Structure Utilizing Memory Array Line Driver with Dual Purpose Driver Device," U.S. patent application Ser. No. 10/306,887, filed Nov. 27, 2002, and in "Tree Decoder Structure Particularly Well Suited to Interfacing Array Lines Having Extremely Small Layout Pitch," U.S. patent application Ser. No. 10/306,888, filed Nov. 27, 2002, which applications are hereby incorporated by reference in their entirety.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are usually contemplated as being connected to the gate terminal of memory cell transistors forming the NAND strings. The Y-lines (or bit lines) are usually contemplated as being connected to the source/drain terminal of the NAND strings. Secondly, the memory organization (e.g., data bus width, number of bits simultaneously read during an operation, etc.) may have some association with viewing one set of the two array lines more aligned with data "bits" rather than data "words." Consequently, the designations herein of X-lines, word lines, and row lines, and of Y-lines, bit lines, and column lines are illustrative of the various embodiments but should not be viewed in a restrictive sense, but rather a more general sense.

As used herein, word lines and bit lines (e.g., including global bit lines) usually represent orthogonal array lines, and follow the common assumption in the art that word lines are driven and bit lines are sensed, at least during a read operation. Thus, the global bit lines of an array may also be referred to as sense lines of the array, and may also be referred to as simply global array lines (i.e., even though other array lines also exist). No particular implication should be drawn as to word organization by use of such terms. Moreover, as used herein, a "global bit line" is an array line that connects to NAND strings in more than one memory block, but no particular inference should be drawn suggesting such a global bit line must traverse across an entire memory array or substantially across an entire integrated circuit.

The directionality of various array lines in the various figures is merely convenient for ease of description of the two groups of crossing lines in the array. While word lines are usually orthogonal to bit lines, such is not necessarily required. Moreover, the word and bit organization of a memory array may also be easily reversed. As an additional example, portions of an array may correspond to different output bits of a given word. Such various array organizations and configurations are well known in the art, and the invention is intended to comprehend a wide variety of such variations.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

It will be appreciated by one skilled in the art that any of several expressions may be equally well used when describing the operation of a circuit including the various signals and nodes within the circuit, and no subtle inferences should be read into varied usage within this description. Frequently logic signals are named in a fashion to convey which level is the active level. The schematic diagrams and accompanying description of the signals and nodes should in context be clear. As used herein, two different voltages which are "substantially equal" to each other have respective values which are close enough to cause substantially the same effect under the context at issue. Such voltages may be assumed to fall within approximately 0.5 volts of each other, unless the context requires another value. For example, a passing voltage of 5 volts or 5.5 volts may cause substantially the same effect as compared to an inhibit bias voltage of 5 volts, and thus the 5.5 volt passing voltage may be considered to be substantially identical to the 5 volt inhibit voltage.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. As is well known in the art, various row and column decoder circuits are implemented for selecting a memory block, a NAND string within the selected block, and a memory cell within the selected NAND string based upon address signals and possibly other control signals. Nonetheless, even though a mere routine exercise of engineering effort is believed to be required to practice this invention, such engineering efforts may result in additional inventive efforts, as frequently occurs in the development of demanding, competitive products.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. In particular, even though many embodiments are described in the context of a three-dimensional memory array of TFT memory cells, such limitations should not be read into the claims unless specifically recited. Moreover, the embodiments described above are specifically contemplated to be used alone as well as in various combinations. Accordingly, other embodiments, variations, and improvements not described herein are not necessarily excluded from the scope of the invention.

What is claimed is:

1. An integrated circuit comprising:
a three-dimensional memory array having a first plane of memory cells disposed above a first dielectric layer disposed above a substrate, and having a second plane of memory cells disposed above a second dielectric layer disposed above the first memory plane, said memory cells comprising modifiable conductance switch devices arranged in a plurality of series-connected NAND strings;
wherein each NAND string within a given memory plane includes a first switch device at a first end thereof for coupling the NAND string to an associated global bit line and further includes a second switch device at a second end thereof opposite the first end for coupling the NAND string to an associated bias node;
wherein a NAND string within the first memory plane and a NAND string within the second memory plane are vertically coupled to a global bit line disposed on a first interconnect layer, and are further vertically coupled to a bias node disposed on a second interconnect layer different than the first interconnect layer.

2. The integrated circuit as recited in claim 1 wherein the memory cells comprise devices having a depletion mode threshold voltage at least some of the time.

3. The integrated circuit as recited in claim 1 wherein the modifiable conductance switch devices comprise first transistors corresponding to a first data state, and second transistors corresponding to a second data state, each transistor having a respective threshold voltage which is determined during manufacture.

4. The integrated circuit as recited in claim 1 wherein the modifiable conductance switch devices comprise transistors having a respective threshold voltage which is modifiable post-manufacture.

5. The integrated circuit as recited in claim 1 wherein the modifiable conductance switch devices comprise transistors having a charge storage dielectric.

6. The integrated circuit as recited in claim 5 wherein the charge storage dielectric of the memory cell transistors comprises an oxide-nitride-oxide (ONO) stack.

7. The integrated circuit as recited in claim 6 wherein the memory cell transistors have a depletion mode threshold voltage when the charge storage dielectric has a minimum stored charge level.

8. The integrated circuit as recited in claim 6 wherein the memory cell transistors have a first depletion mode threshold voltage corresponding to an erased data state and have a second depletion mode threshold voltage corresponding to a programmed data state.

9. The integrated circuit as recited in claim 6 wherein the memory cell devices have more than two nominal values of conductance, for storing more than one bit of data per memory cell.

10. The integrated circuit as recited in claim 1 wherein two NAND strings having word lines in common share a single global bit line.

11. The integrated circuit as recited in claim 10 wherein pairs of NAND strings are arranged so that a first control signal coupling one string of the pair to its associated global array line couples the other string of the pair to its associated bias node.

12. The integrated circuit as recited in claim 11 wherein an associated bias node for a given NAND string is also associated with another NAND string having different word lines.

13. The integrated circuit as recited in claim 1 wherein the first switch device of each respective NAND string comprises a transistor having a charge storage dielectric.

14. The integrated circuit as recited in claim 13 wherein the first switch device of each respective NAND string has a depletion mode threshold voltage.

15. The integrated circuit as recited in claim 1 wherein the substrate comprises a monocrystalline substrate including circuitry which is coupled to the memory array.

16. The integrated circuit as recited in claim 1 wherein the substrate comprises a polycrystalline substrate.

17. The integrated circuit as recited in claim 1 wherein the substrate comprises an insulating substrate.

18. The integrated circuit as recited in claim 1 wherein the switch devices and memory cell devices forming each NAND string are structurally substantially identical.

19. The integrated circuit as recited in claim 1 wherein a respective plurality of NAND strings on each of the first and second memory planes are coupled to a single global array line disposed on a single layer of the integrated circuit.

20. A computer readable medium encoding an integrated circuit, said encoded integrated circuit comprising:
a three-dimensional memory array having a first plane of memory cells disposed above a first dielectric layer disposed above a substrate, and having a second plane of memory cells disposed above a second dielectric layer disposed above the first memory plane, said memory cells comprising modifiable conductance switch devices arranged in a plurality of series-connected NAND strings;
wherein each NAND string within a given memory plane includes a first switch device at a first end thereof for coupling the NAND string to an associated global bit line and further includes a second switch device at a second end thereof opposite the first end for coupling the NAND string to an associated bias node;
wherein a NAND string within the first memory plane and a NAND string within the second memory plane are vertically coupled to a global bit line disposed on a first interconnect layer, and are further vertically coupled to a bias node disposed on a second interconnect layer different than the first interconnect layer.

21. The computer readable medium as recited in claim 20 wherein the modifiable conductance switch devices comprise transistors having a charge storage dielectric.

22. The computer readable medium as recited in claim 20 wherein two NAND strings having word lines in common share a single global bit line.

23. The computer readable medium as recited in claim 22 wherein pairs of NAND strings are arranged so that a first control signal coupling one string of the pair to its associated global array line couples the other string of the pair to its associated bias node.

24. The computer readable medium as recited in claim 23 wherein an associated bias node for a given NAND string is also associated with another NAND string having different word lines.

25. The computer readable medium as recited in claim 20 wherein the first switch device of each respective NAND string comprises a transistor having a charge storage dielectric.

26. The computer readable medium as recited in claim 25 wherein the first switch device of each respective NAND string has a depletion mode threshold voltage.

27. The computer readable medium as recited in claim 20 wherein the switch devices and memory cell devices forming each NAND string are structurally substantially identical.

28. An integrated circuit comprising:
a three-dimensional memory array having at least two planes of memory cells formed above a dielectric layer that is formed above a substrate, said memory cells comprising modifiable conductance switch devices arranged in a plurality of series-connected NAND strings; and
a plurality of global array lines disposed on a layer of the integrated circuit, each of which is shared by at least one NAND string on each of at least two memory planes;
a second plurality of array lines disposed on a second layer of the integrated circuit different than the first layer, each of said second plurality of array lines shared by a respective plurality of NAND strings on each of at least two memory planes;
wherein each NAND string includes a first switch device at a first end thereof for coupling the NAND string to an associated global array line; and wherein the first switch device within a given NAND string is structurally substantially identical with the memory cell devices forming the given NAND string.

29. The integrated circuit as recited in claim 28 wherein at least two NAND strings on each of at least two memory planes make contact to an associated global array line by way of a shared zia.

30. The integrated circuit as recited in claim 28 wherein the modifiable conductance switch devices comprise transistors having a charge storage dielectric.

31. The integrated circuit as recited in claim 28 wherein at least one NAND string on each of at least two memory planes are coupled to an associated global array line by way of a single zia.

32. The integrated circuit as recited in claim 31 wherein at least four NAND strings on each of at least two memory planes are coupled to an associated global array line by way of a single zia.

* * * * *

UNITED STATES PATENT AND TRADEMARK OFFICE
CERTIFICATE OF CORRECTION

PATENT NO. : 7,505,321 B2
APPLICATION NO. : 10/335078
DATED : March 17, 2009
INVENTOR(S) : Roy E. Scheuerlein et al.

It is certified that error appears in the above-identified patent and that said Letters Patent is hereby corrected as shown below:

Title Page, Item (75), line 9, please replace "Koutnetsov" with --Kouznetsov--

Signed and Sealed this

Twenty-first Day of April, 2009

JOHN DOLL
*Acting Director of the United States Patent and Trademark Office*